(12) United States Patent
Kume

(10) Patent No.: US 10,566,311 B2
(45) Date of Patent: Feb. 18, 2020

(54) SEMICONDUCTOR DEVICE

(71) Applicant: TOSHIBA MEMORY CORPORATION, Minato-ku (JP)

(72) Inventor: Ippei Kume, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 211 days.

(21) Appl. No.: 15/702,156

(22) Filed: Sep. 12, 2017

(65) Prior Publication Data
US 2018/0277516 A1 Sep. 27, 2018

(30) Foreign Application Priority Data

Mar. 21, 2017 (JP) ................. 2017-054722

(51) Int. Cl.
*H01L 25/065* (2006.01)
*H01L 49/02* (2006.01)
*H01L 23/48* (2006.01)
*H01L 23/528* (2006.01)
*H01L 23/00* (2006.01)

(52) U.S. Cl.
CPC ........ *H01L 25/0657* (2013.01); *H01L 23/481* (2013.01); *H01L 23/528* (2013.01); *H01L 24/17* (2013.01); *H01L 28/10* (2013.01); *H01L 2223/6677* (2013.01)

(58) Field of Classification Search
None
See application file for complete search history.

(56) References Cited

U.S. PATENT DOCUMENTS

| 7,239,013 B2 | 7/2007 | Shimada et al. |
| 7,531,417 B2 | 5/2009 | Lin |
| 2004/0021218 A1* | 2/2004 | Hayama ........... G06K 19/07749 257/700 |
| 2007/0194427 A1* | 8/2007 | Choi ................... H01L 23/3121 257/686 |
| 2010/0127937 A1 | 5/2010 | Chandrasekaran et al. |

(Continued)

FOREIGN PATENT DOCUMENTS

| JP | 2011-146616 | 7/2011 |
| JP | 2012-509653 | 4/2012 |

(Continued)

*Primary Examiner* — Angel Roman
(74) *Attorney, Agent, or Firm* — Oblon, McClelland, Maier & Neustadt, L.L.P.

(57) ABSTRACT

A semiconductor device includes a first and a second chips. A first inductor is above a first surface or a second surface located on an opposite side to the first surface. A first metal electrode is between the first and second surface to penetrate through the first substrate and to be connected to the first inductor. The second chip includes a second element provided on a third surface of a second substrate. A second inductor provided above a third surface of the second substrate or a fourth surface located on an opposite side to the third surface. A second metal electrode is provided between the third surface and the fourth surface to penetrate through the second substrate and to be connected to the second inductor. The first and second chips are stacked. The first and second inductors are electrically connected via the first or second metal electrode, as one inductor.

11 Claims, 20 Drawing Sheets

(56) References Cited

U.S. PATENT DOCUMENTS

| | | | |
|---|---|---|---|
| 2011/0084358 A1* | 4/2011 | Kim | H01L 23/481 |
| | | | 257/531 |
| 2012/0319912 A1 | 12/2012 | Taguchi | |
| 2015/0311159 A1* | 10/2015 | Hsieh | H01L 23/5384 |
| | | | 257/737 |
| 2018/0323144 A1* | 11/2018 | Kirby | H01L 23/5227 |
| 2018/0323145 A1* | 11/2018 | Kirby | H01L 25/0657 |

FOREIGN PATENT DOCUMENTS

| | | |
|---|---|---|
| JP | 2013-5252 | 1/2013 |
| TW | I225380 B | 12/2004 |
| TW | I312181 B | 7/2009 |

\* cited by examiner

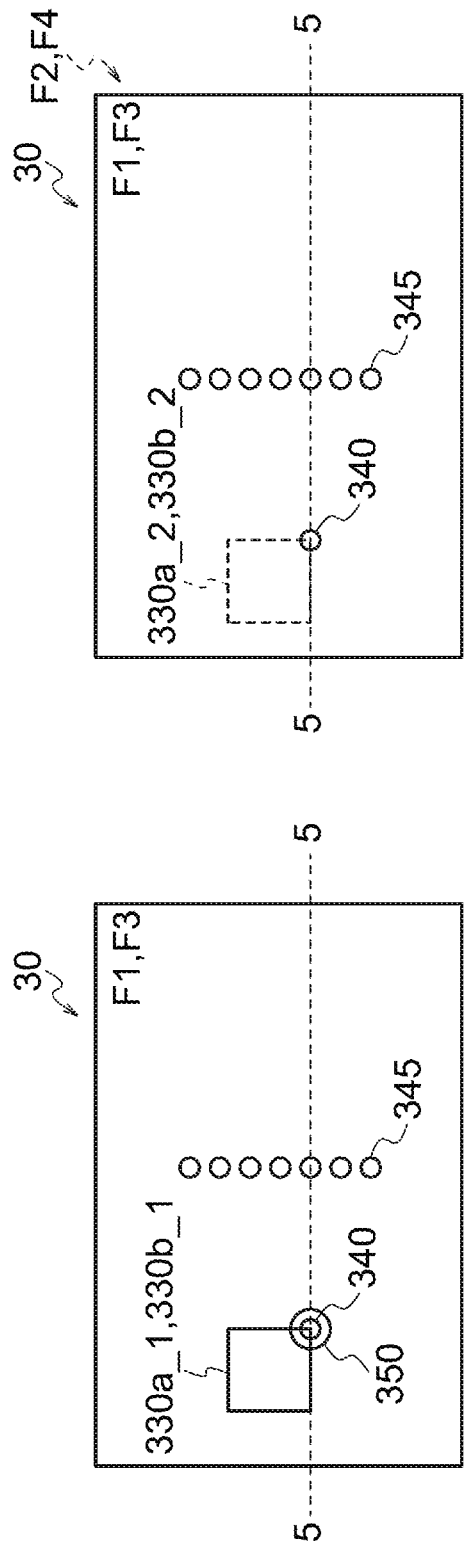

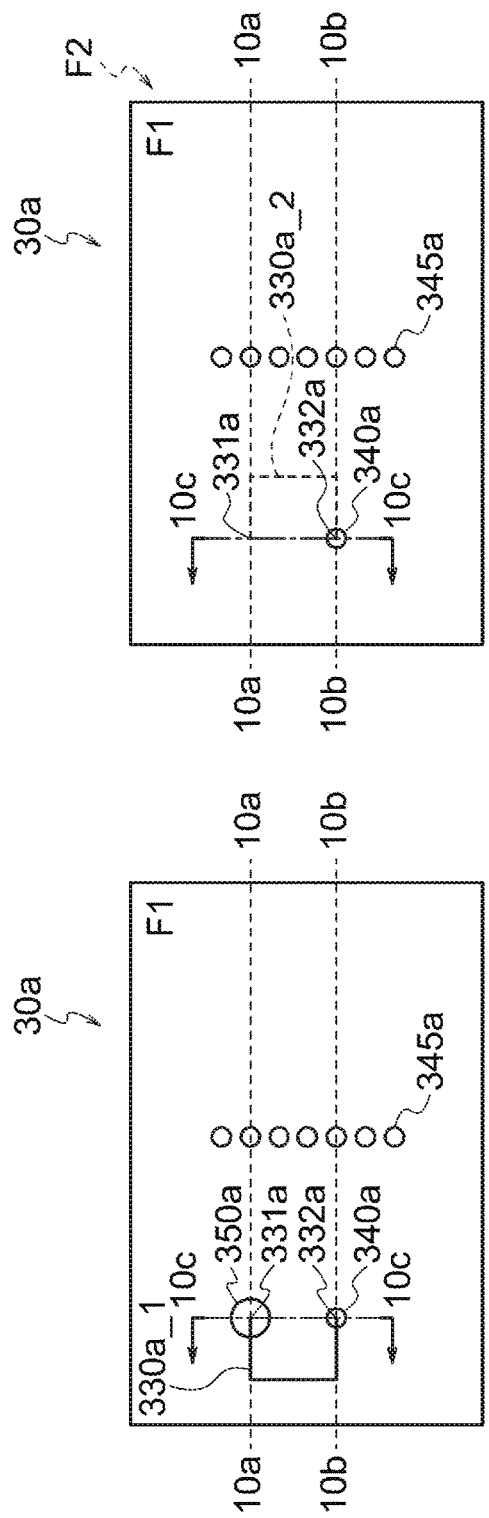
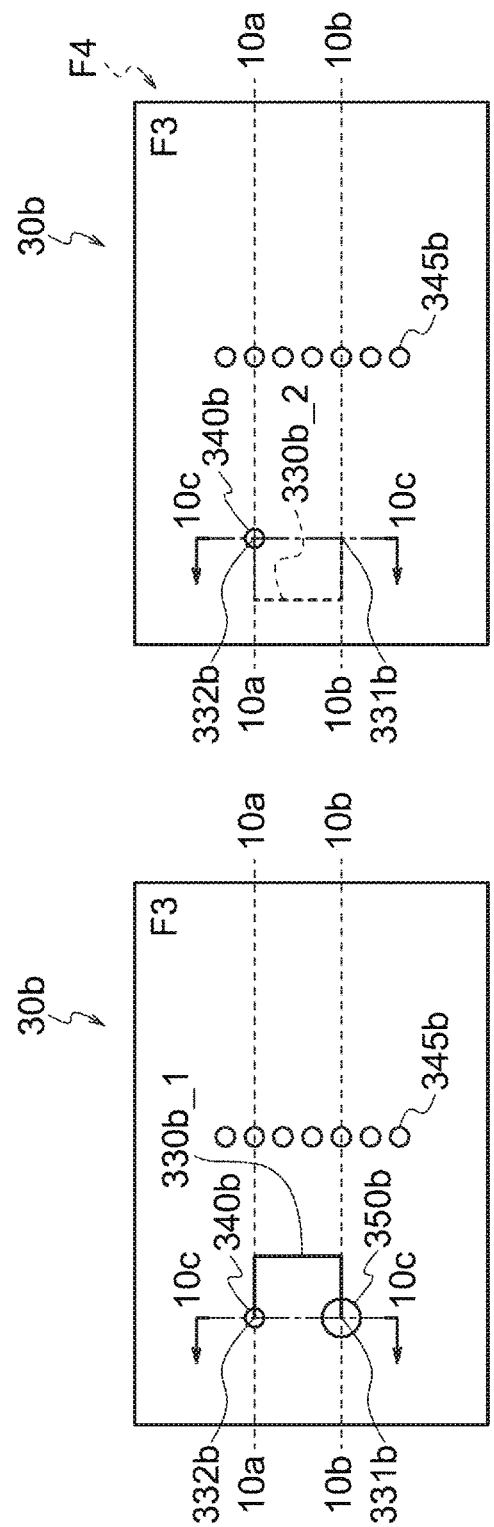
FIG. 11A  FIG. 11B  FIG. 11C  FIG. 11D

SEMICONDUCTOR DEVICE

CROSS REFERENCE TO RELATED APPLICATIONS

This application is based upon and claims the benefit of priority from the prior Japanese Patent Application No. 2017-054722, filed on Mar. 21, 2017, the entire contents of which are incorporated herein by reference.

FIELD

The embodiments of the present invention relate to a semiconductor device.

BACKGROUND

Techniques for connecting things to a network, such as an IoT (Internet of Things) technique, are being developed in recent years. In the IoT technique, it is considered to connect things to the Internet via wireless communication. Information on the things achieved via the Internet is required to be stored in a server or the like for analysis or the like thereof. A memory having a wireless communication function is demanded in order to store such information.

However, communication performance of an inductor element used for wireless communication largely depends on the area thereof. Therefore, there is a problem that downscaling of a memory is difficult when a wireless communication function is to be combined with the memory.

BRIEF DESCRIPTION OF THE DRAWINGS

FIGS. 6A and 6B are plan views illustrating a configuration example of the semiconductor chip on an insulation film covering the semiconductor element, according to the present modification;

FIGS. 11A to 11D are plan views illustrating a configuration on an insulation film covering the semiconductor element according to the modification of the second embodiment;

DETAILED DESCRIPTION

A semiconductor device according to an embodiment includes a first semiconductor chip and a second semiconductor chip. The first semiconductor chip includes a first semiconductor element provided on a first surface of a first semiconductor substrate. A first inductor portion is provided above the first surface of the first semiconductor substrate or a second surface located on an opposite side to the first surface. A first metal electrode is provided between the first surface and the second surface to penetrate through the first semiconductor substrate and to be connected to the first inductor portion. The second semiconductor chip includes a second semiconductor element provided on a third surface of a second semiconductor substrate. A second inductor portion provided above a third surface of the second semiconductor substrate or a fourth surface located on an opposite side to the third surface. A second metal electrode is provided between the third surface and the fourth surface to penetrate through the second semiconductor substrate and to be connected to the second inductor portion. The first and second semiconductor chips are stacked. The first and second inductor portions are electrically connected to each other via the first or second metal electrode, as one inductor element.

Embodiments will now be explained with reference to the accompanying drawings. The present invention is not limited to the embodiments. In the following embodiments, a vertical direction of a semiconductor substrate represents a relative direction when a surface on which a semiconductor element is provided or a back surface on an opposite side to the corresponding surface is assumed to be the top, and may be different from a vertical direction in accordance with gravitational acceleration.

(First Embodiment)

Figure 1:
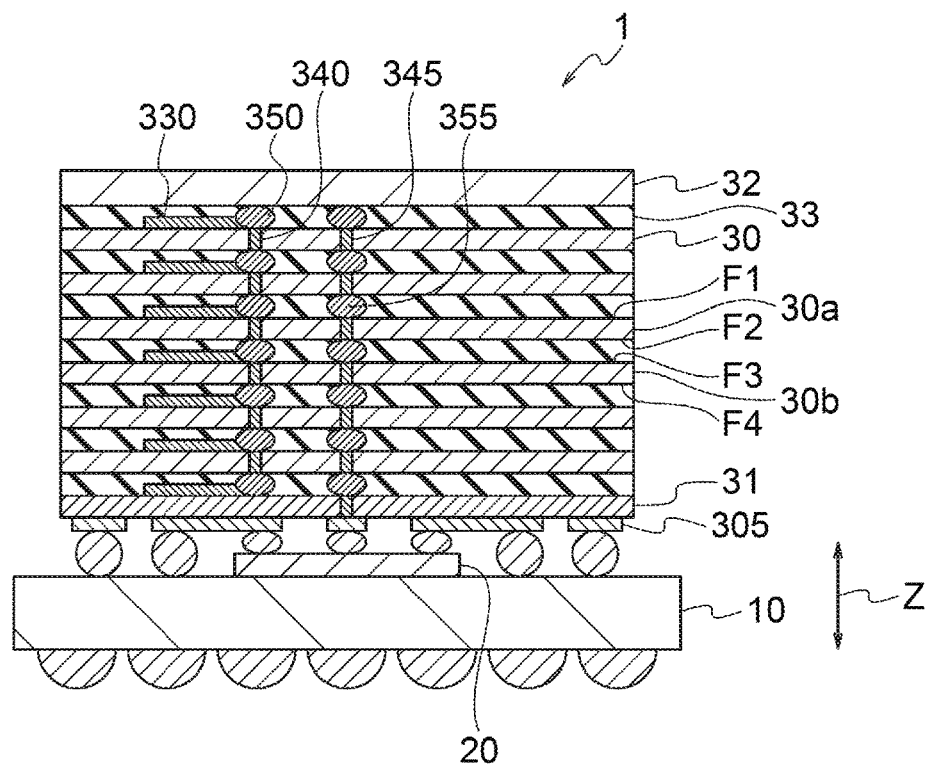
FIG. 1 is a cross-sectional view illustrating a configuration example of a semiconductor device according to a first embodiment.

FIG. 1 is a cross-sectional view illustrating a configuration example of a semiconductor device 1 according to a first embodiment. The semiconductor device 1 is a semiconductor device that includes a NAND EEPROM (Electrically Erasable and Programmable Read-Only Memory), for example, and has a communication function. The semiconductor device 1 can acquire information from a sensor or the like attached to another object in an IoT technique or the like, store the information in the NAND EEPROM included therein, and transmit the information to an external server or the like via wireless communication. Also, the semiconductor device 1 may be able to acquire information from an external server or the like via wireless communication and to store the information in the NAND EEPROM included therein.

The semiconductor device 1 includes a BGA (Ball Grid Array) substrate 10, a NAND controller 20, and semiconductor chips 30 to 32.

The BGA substrate 10 is a package substrate in which solder balls are arranged in a grid as electrodes on a bottom surface of the substrate.

The NAND controller 20 is provided on the BGA substrate 10 and is electrically connected to the semiconductor chip 30. The NAND controller 20 controls a semiconductor element in the semiconductor chip 30.

One semiconductor chip 31, a plurality of semiconductor chips 30, and one semiconductor chip 32 are stacked and provided on the BGA substrate 10 and the NAND controller 20. The semiconductor chip 31 provided at the lowest portion includes a re-distribution layer (RDL) 305 on a bottom surface thereof. With this re-distribution layer 305, the semiconductor chip 31 is connected to the BGA substrate 10 and the NAND controller 20 via bumps. The semiconductor chip 31 is different from the semiconductor chip 30 in having a re-distribution structure. However, other configurations of the semiconductor chip 31 may be identical to corresponding configurations of the semiconductor chip 30.

The semiconductor chips 30 are stacked on the semiconductor chip 31. The semiconductor chips 30 are electrically connected to the BGA substrate 10 and the NAND controller 20 via the semiconductor chip 31. Each semiconductor chip 30 includes an inductor portion 330, a TSV (Through-Silicon Via) 340, and a bump 350.

The inductor portion 330 is electrically connected to the TSV 340. The TSV 340 penetrates through the semiconductor chip 30 and is connected to a bump 350 of another semiconductor chip 30, so that the TSV 340 is electrically connected to an inductor portion 330 of the other semiconductor chip 30 via the bump 350. That is, the TSV 340 and the bump 350 electrically connect inductor portions 330 of the semiconductor chips 30 adjacent to each other in a stacking direction (Z-direction) of the semiconductor chips 30, to each other. With this configuration, the inductor portions 330 of the respective semiconductor chips 30 are electrically connected to each other via the bumps 350 and the TSVs 340 to form one inductor element.

A TSV 345 for power supply is provided at a center portion of each semiconductor chip 30. The TSVs 345 are electrically connected to each other via bumps 355, and are also connected to the NAND controller 20. The TSVs 345 are provided for supplying power to the respective semiconductor chips 30. A more detailed configuration of the semiconductor chip 30 will be described later.

The semiconductor chip 32 is further stacked on the stacked semiconductor chips 30. While the semiconductor chip 32 may include a semiconductor element 320, a wire, the TSV 340, and the like, it is not particularly necessary.

Package materials 33, such as fillers or resin, are provided between the stacked semiconductor chips 30 to 32. With this configuration, the semiconductor device 1 is packaged.

Although the number of the semiconductor chips 30 stacked between the semiconductor chips 31 and 32 in FIG. 1 is six, it is not particularly limited thereto.

Further, the semiconductor chips 30 are distinguished from each other when descriptions thereof are made later with reference to FIG. 4. It is assumed that, among the semiconductor chips 30 illustrated in FIG. 1, a certain semiconductor chip 30 is a first semiconductor chip 30a and a semiconductor chip 30 located below and adjacent to the first semiconductor chip 30a in the Z-direction is a second semiconductor chip 30b.

Next, a configuration of each semiconductor chip 30 is described. The semiconductor chip 31 is obtained by further providing the re-distribution layer 305 on the semiconductor chip 30. Therefore, description of a configuration of the semiconductor chip 31 is omitted. Further, descriptions of a configuration of the semiconductor chip 32 are omitted herein because the configuration of the semiconductor chip 32 is not directly relevant to the first embodiment.

Figure 2:
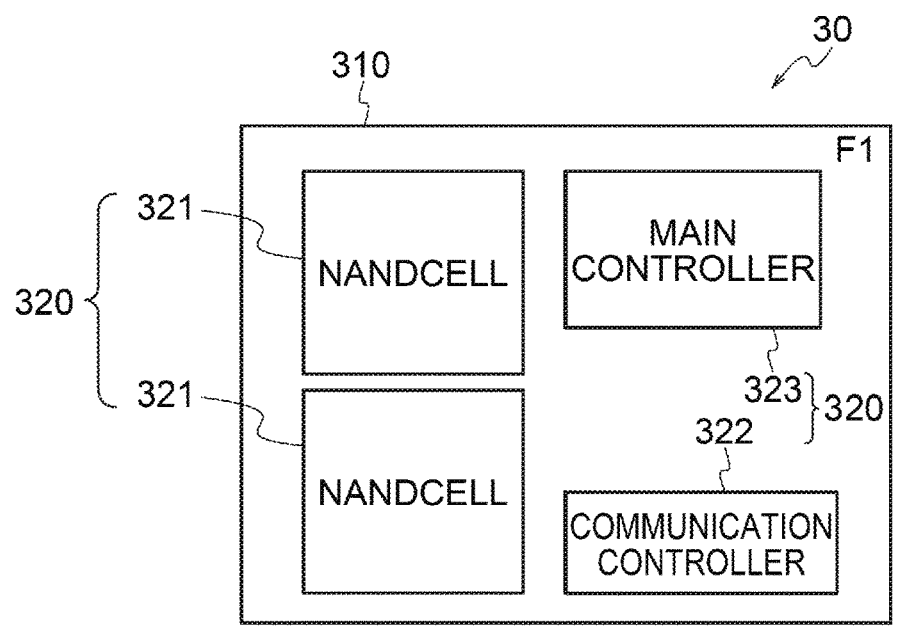
FIG. 2 is a plan view illustrating an example of a schematic configuration of the semiconductor chip according to the first embodiment.

FIG. 2 is a plan view illustrating an example of a schematic configuration of the semiconductor chip 30 according to the first embodiment. FIG. 2 illustrates the semiconductor chip 30 as viewed in a stacking direction.

The semiconductor chip 30 as the first or second semiconductor chip includes a semiconductor substrate 310, NAND cells 321, a communication controller 322, and a main controller 323. The semiconductor substrate 310 as a first or second semiconductor substrate is a silicon substrate, for example. A semiconductor element (a first or second semiconductor element), such as the NAND cell 321, the communication controller 322, and the main controller 323, is provided on a first surface F1 of the semiconductor substrate 310. The semiconductor element 320 may be provided on a second surface F2 (see FIG. 1) located on an opposite side to the first surface F1 of the semiconductor substrate 310.

The NAND cell 321 is a memory cell array provided on the first surface F1 of the semiconductor substrate 310. The NAND cell 321 may be a two-dimensionally arranged memory cell array, or may be a three-dimensionally arranged memory cell array. The NAND cell 321 stores therein information received from a sensor, a server, or the like arranged outside the semiconductor chip 30. While FIG. 2 illustrates two NAND cells 321, the number of the NAND cells 321 is not limited thereto. For example, the number of the NAND cells 321 may be one, or three or more. Further, the NAND cell 321 can be any type of memory cell other than the NAND cell.

The communication controller 322 controls wireless communication performed by the semiconductor chip 30. For example, the communication controller 322 transfers information received by the inductor portion 330 to the main controller 323. The main controller 323 writes the information from the communication controller 322 into the NAND cell 321. Conversely, the communication controller 322 may output information read by the main controller 323 from the NAND cell 321 to outside via the inductor portion 330.

The main controller 323 controls the NAND cell 321 and the communication controller 322, and writes information from the communication controller 322 into the NAND cell 321 or reads information from the NAND cell 321.

Figure 3:
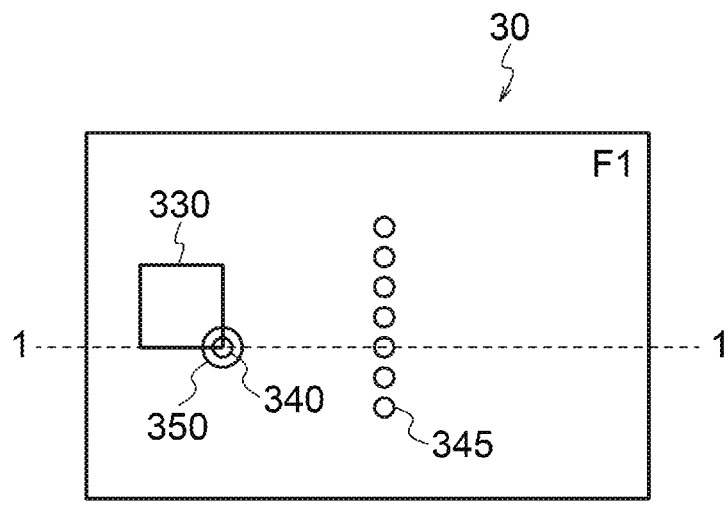
FIG. 3 is a plan view illustrating a configuration example of the semiconductor chip on an insulation film layer that is different from a layer in which the semiconductor element illustrated in FIG. 2 is formed.

FIG. 3 is a plan view illustrating a configuration example of the semiconductor chip 30 on an insulation film layer that is different from a layer in which the semiconductor element 320 illustrated in FIG. 2 is formed. FIG. 1 corresponds to a cross-section taken along a line 1-1 in FIG. 3.

The semiconductor chip 30 as the first or second semiconductor chip includes the inductor portion 330 provided on an insulation film (not illustrated) covering a semiconductor element, such as the NAND cell 321, and the bump 350. The semiconductor chip 30 further includes the TSV 340 penetrating through the first surface F1 and the second surface F2 of the semiconductor substrate 310.

The inductor portion 330 and the bump 350 described below are provided above the first surface F1 of the semiconductor substrate 310, and are provided on the insulation film covering the semiconductor element, such as the NAND cell 321. Therefore, the layout of the inductor portion 330 and the bump 350 is not restricted by the layout of the NAND cell 321, the communication controller 322, and the main controller 323, for example, and can be designed highly flexibly. That is, in the planar layout illustrated in FIG. 2, the inductor portion 330 and the bump 350 may overlap the semiconductor element, such as the NAND cell 321. Alternatively, the inductor portion 330 and the bump 350 may be provided above the second surface F2 (see FIG. 1) on the opposite side to the first surface F1. It suffices that the inductor portion 330 and the bump 350 are formed in an identical method to the re-distribution layer 305.

The inductor portion 330 as a first or second inductor portion is provided as a single-turn coil that has a square shape, as illustrated in FIG. 3, for example. However, the shape of the inductor portion 330 is not limited thereto, but may be a circle, a triangle, a rectangle, or another polygon, so long as the inductor portion 330 is substantially annular. The material of the inductor portion 330 is solder, for example. Alternatively, the material of the inductor portion 330 may be Sn or Cu that is the same as the bump 350 or the re-distribution layer 305. However, the material of the inductor portion 330 is not limited thereto, but may be any material so long as it is a conductive material having inductance.

The arrangement of the inductor portion 330 is not particularly limited as described above. However, it is preferable that the inductor portion 330 is arranged at such a position that the inductor portion 330 does not adversely affect the semiconductor element, such as the NAND cell 321, the communication controller 322, and the main controller 323. Further, it is preferable that the inductor portion 330 is arranged at such a position that the inductor portion 330 does not come into contact with the TSV 345 for power supply located at the center portion of the semiconductor substrate 310. This is because, when the inductor portion 330 comes into contact with the TSV 345 for power supply, the inductor portion 330 may not function as an antenna and may also adversely affect the power supply. The number of the inductor portions 330 provided on each semiconductor substrate 310 is not also particularly limited, and may be plural. In this case, it suffices that the same numbers of the TSV 340 and the bumps 350 as the number of the inductor portions 330 are provided.

The TSV 340 as a first or second metal electrode is connected to the bump 350, and is connected to the inductor portion 330 via the bump 350. The TSV 340 electrically connects the inductor portion 330 to an inductor portion 330 and a bump 350 of another semiconductor chip 30.

For example, the inductor portion 330 has a square shape, and the TSV 340 is located at a corner of the square. However, it suffices that the TSV 340 is connected to the inductor portion 330, and the TSV 340 may be located at a side portion of the inductor portion 330. The TSV 340 is made of any of Ti, Cu, Ni, Au, and Sn, or a stacked body thereof, or alloy thereof. The TSV 340 is formed by lithography, etching, and the like. An insulation film (not illustrated) is provided between the TSV 340 and the semiconductor chip 30. Therefore, the TSV 340 and the semiconductor chip 30 are not electrically connected to each other.

The semiconductor chip 30 further includes the TSV 345 having the same structure as the TSV 340. The TSV 345 is provided at the center portion of the semiconductor substrate 310 in order to connect a power supply to the NAND cell 321, the communication controller 322, and the main controller 323. An insulation film (not illustrated) is also provided between the TSV 345 and the semiconductor chip 30, similarly to a portion between the TSV 340 and the semiconductor chip 30.

The bump 350 as a first or second bump is provided on the inductor portion 330. The bump 350 is electrically connected to a TSV 340 of a semiconductor chip 30 stacked on the semiconductor chip 30 in which the bump 350 is provided. That is, when the semiconductor chips 30 are stacked, the bump 350 electrically connects TSVs 340 of semiconductor chips 30 adjacent to each other in the Z-direction, to each other, as described with reference to FIG. 1. With this configuration, inductor portions 330 of the semiconductor chips 30 mutually adjacent in the Z-direction are electrically connected to each other. The material of the bump 350 may be Sn or Cu, for example.

As illustrated in FIG. 3, a position at which the bump 350 is provided overlaps a position at which the TSV 340 is provided. Due to this overlapping, it is possible to electrically connect the inductor portions 330 via the TSV 340 and the bump 350 by stacking the semiconductor chips 30 having the same configuration, as illustrated in FIG. 4. According to the first embodiment, because it suffices that the semiconductor chips 30 having the same configuration are simply stacked, the manufacturing process of the semiconductor device 1 can be more simplified. However, it is not always necessary that the positions of the bump 350 and the TSV 340 overlap each other.

The semiconductor device 1 illustrated in FIG. 1 can be obtained by stacking the semiconductor chips 30 between the semiconductor chip 31 and the semiconductor chip 32.

Figure 4:
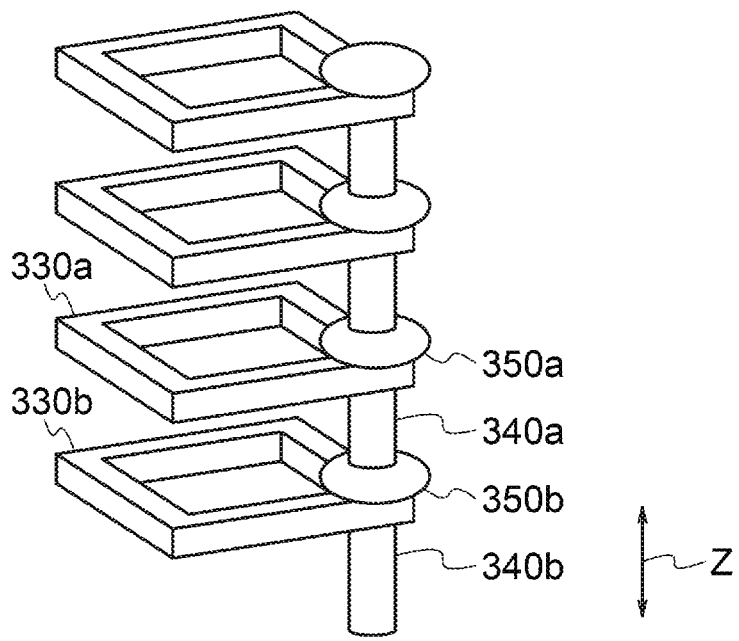
FIG. 4 is a perspective view schematically illustrating the inductor portions, the TSVs, and the bumps of the stacked semiconductor chips according to the first embodiment.

FIG. 4 is a perspective view schematically illustrating the inductor portions 330, the TSVs 340, and the bumps 350 of the stacked semiconductor chips 30 according to the first embodiment. In order to distinguish each of the inductor portion 330, the TSV 340, and the bump 350 from among respective ones of the semiconductor chips 30, the first and second semiconductor chips 30a and 30b are distinguished from each other, as described with reference to FIG. 1. In association with this distinguishing, "a" or "b" is added to reference signs of the inductor portion, the TSV, and the bump in FIG. 4 for the sake of convenience. A relation between arrangements of the first and second semiconductor chips 30a and 30b is illustrated in FIG. 1. Note that "a" and "b" in the reference signs are added simply for distinguishing of constitutional elements, and are not intended to mean that constitutional elements with "a" and "b" respectively belong to the semiconductor chips 30a and 30b.

A first inductor portion 330a of the first semiconductor chip 30a is provided above the first surface F1 of the first semiconductor chip 30a. A first bump 350a is electrically connected to the first inductor portion 330a and a first TSV 340a. The first bump 350a may be provided in the same layer as the first inductor portion 330a or on the first inductor portion 330a. Alternatively, the first bump 350a may be a bump provided on a back surface side of a semiconductor chip above the first semiconductor chip 30a. The first TSV 340a as the first metal electrode is provided between the first surface F1 and the second surface F2 in FIG. 1, penetrates through the first semiconductor chip 30a, and is connected to the first inductor portion 330a and the first bump 350a. The first TSV 340a can lead the first inductor portion 330a on the first surface F1 side to the second surface F2 side to electrically connect the first inductor portion 330a to a second bump 350b and a second inductor portion 330b of the second semiconductor chip 30b arranged on the second surface F2 side.

The second inductor portion 330b of the second semiconductor chip 30b is provided above a third surface F3 of the second semiconductor chip 30b. The second bump 350b is electrically connected to the second inductor portion 330b and a second TSV 340b. The second bump 350b may be provided in the same layer as the second inductor portion 330b or on the second inductor portion 330b. Alternatively, the second bump 350b may be a bump provided on a back surface side of the first semiconductor chip 30a. The second TSV 340b as the second metal electrode is provided between the third surface F3 and the fourth surface F4 in FIG. 1, penetrates through the second semiconductor chip 30b, and is connected to the second inductor portion 330b and the second bump 350b. The second TSV 340b can lead the second inductor portion 330b on the third surface F3 side to the fourth surface F4 side to electrically connect the second inductor portion 330b to a bump 350 and an inductor portion 330 arranged on the fourth surface F4 side.

The first TSV 340a electrically connects the first inductor portion 330a and the second bump 350b to each other. With this configuration, the first inductor portion 330a of the first semiconductor chip 30a and the second inductor portion 330b of the second semiconductor chip 30b are electrically connected to each other via the first TSV 340a and the second bump 350b. An inductor portion 330 of another semiconductor chip 30 is also connected in the same manner as the first and second inductor portions 330a and 330b. Therefore, the inductor portions 330 including the first inductor portion 330a and the second inductor portion 330b are electrically connected to each other as one inductor element via the TSVs 340 and the bumps 350. As the semiconductor chips 30 are viewed in the stacking direction (Z-direction), the inductor portions 330 overlap each other and the TSVs 340 also overlap each other. Shapes of the inductor portions 330 of the semiconductor chips 30 are substantially the same as each other, and positions of the TSVs 340 are also substantially the same as each other. That is, the inductor portion 330, the TSV 340, and the bump 350 of one semiconductor chip 30 are stacked as one unit. The bump 350 may be provided on either of two semiconductor chips located above and below the bump 350, or may be provided on both the two semiconductor chips. Because the semiconductor chips 30 to be stacked can have substantially the same configuration as described above, it is possible to manufacture the semiconductor chips 30 simply by the same manufacturing process.

The number of the inductor portions 330 included in one inductor element is determined by the number of the stacked semiconductor chips 30 to 32. For example, because the semiconductor chip 32 does not include the inductor portion 330 as illustrated in FIG. 1, the number of the inductor portions 330 included in one inductor element is 7 that corresponds to the number of the semiconductor chips 31 and 30. Similarly, in a case where the number of the stacked semiconductor chips 30 to 32 is 16, the number of the inductor portions 330 included in one inductor element is 15.

In this manner, the stacked semiconductor chips 30 each include the inductor portion 330 provided on the first surface F1 or the second surface F2 of the semiconductor substrate 310 in the semiconductor device 1 according to the first embodiment. The inductor portions 330 of the stacked semiconductor chips 30 are electrically connected to each other via the TSV 340 that is provided between the first surface F1 and the second surface F2 and penetrates through the semiconductor substrate 310. With this configuration, the inductor portions 330 form one inductor element. The inductor element functions as an antenna that can communicate with outside of the semiconductor device 1.

In a case where the semiconductor device 1 does not include the inductor element, it is necessary to provide an antenna coil outside the semiconductor device 1. In this case, because the wiring distance from an external antenna coil to the semiconductor element 320 becomes long, signal loss caused by electric resistance on the wire becomes large.

On the other hand, the semiconductor device 1 according to the first embodiment includes both the inductor element having an antenna function and the semiconductor element 320 inside a package thereof. Therefore, a wire from the inductor element to the semiconductor element 320 is relatively short, and the signal loss can be suppressed.

Further, in a case where the inductor portion 330 is provided on the semiconductor substrate 310 as with the semiconductor element 320, antenna performance (for example, a Q factor) is in proportion to the area of an antenna coil, that is, the area of the inductor portion 330. The area of the inductor portion 330 increases in order to improve the antenna performance, and therefore the area of the semiconductor element 320, such as the NAND cell 321, is limited. Accordingly, downscaling of the semiconductor device 1 is hindered when the inductor portion 330 is provided on the semiconductor substrate 310.

On the other hand, the inductor portion 330 according to the first embodiment is provided on an insulation film (an interlayer dielectric film) covering the semiconductor element 320. That is, the inductor portion 330 can be provided above the semiconductor element 320, such as the NAND cell 321, and can be arranged to overlap the semiconductor element 320 as viewed in the stacking direction. Therefore, it is possible to increase the area of the inductor portion 330 without affecting the area of the NAND cell 321. Therefore, the semiconductor device 1 according to the first embodiment is excellent in downscaling, while having a wireless communication function.

(Modification)

Figure 5:
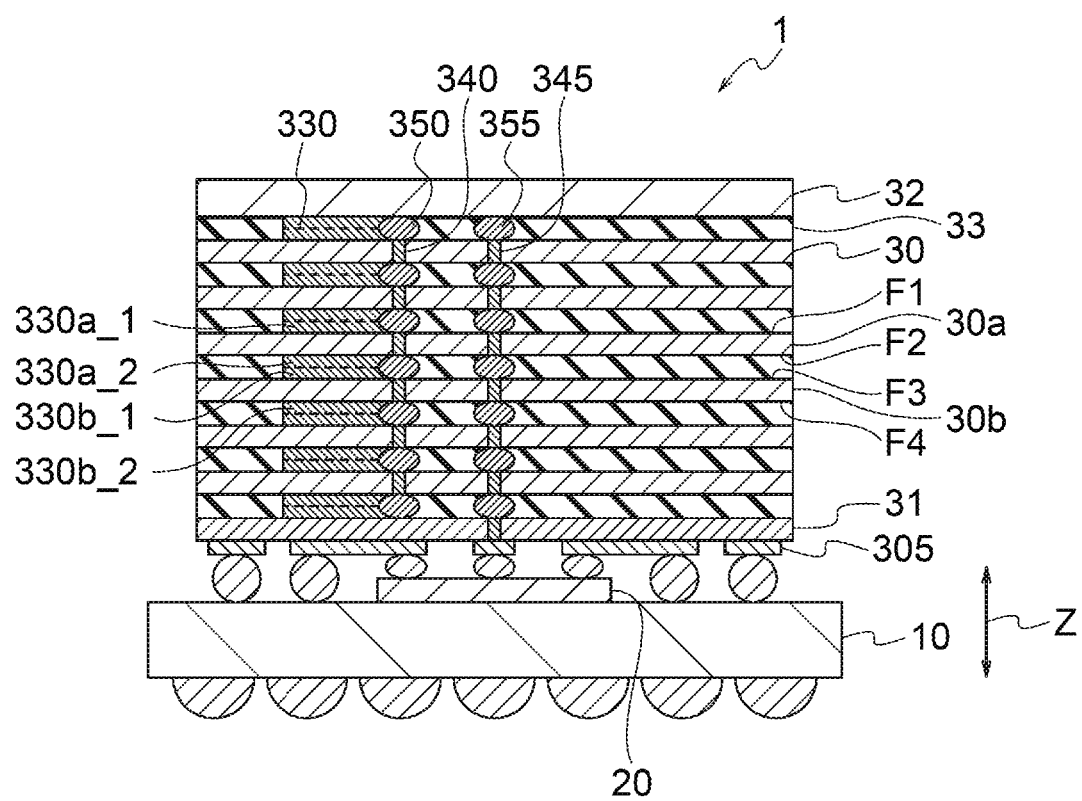
FIG. 5 is a cross-sectional view illustrating a configuration example of the semiconductor device according to a modification of the first embodiment.

FIG. 5 is a cross-sectional view illustrating a configuration example of the semiconductor device 1 according to a modification of the first embodiment. The difference from the semiconductor device 1 according to the first embodiment is the configuration of the inductor portion 330. Therefore, detailed descriptions of other configurations are omitted.

The first inductor portion 330a according to the first embodiment is provided on either the first surface F1 or the second surface F2 of a first semiconductor substrate 310a. The second inductor portion 330b is provided on either the third surface F3 or the fourth surface F4 of a second semiconductor substrate 310b. However, first inductor portions 330a_1 and 330a_2 of the present modification are respectively provided on both the first surface F1 side and the second surface F2 side of the first semiconductor chip 30a. Similarly, in the second semiconductor chip 30b, second inductor portions 330b_1 and 330b_2 are respectively provided on both the third surface F3 side and the fourth surface F4 side. Further the inductor portions 330a_2 and 330b_1 provided to be opposed to each other in the first and second semiconductor chips 30a and 30b adjacent to each other in the Z-direction are bonded to each other by thermal press fitting to form one inductor portion 330. Therefore, the configuration of the inductor element itself is the same as that illustrated in FIG. 4. However, the press-fitted inductor portion 330 (for example, 330a_2 and 330b_1) is larger in the cross-sectional area when being cut along the Z-direction, as compared with that in the first embodiment. Accordingly, antenna performance of the inductor element of the present modification is improved as compared with that in the first embodiment.

FIGS. 6A and 6B are plan views illustrating a configuration example of the semiconductor chip 30 on an insulation film covering the semiconductor element 320, according to the present modification. FIG. 5 corresponds to a cross-section taken along a line 5-5 in FIGS. 6A and 6B.

FIG. 6A illustrates a configuration on the first surface F1 side of the first semiconductor chip 30a (or the third surface F3 side of the second semiconductor chip 30b). FIG. 6B illustrates a configuration on the second surface F2 side of the first semiconductor chip 30a (or the fourth surface F4 side of the second semiconductor chip 30b), as viewed from the first surface F1 side. That is, both FIGS. 6A and 6B are views when the first semiconductor chip 30a or the second semiconductor chip 30b is viewed from the first surface F1 or the third surface F3, and the inductor portions 330a_2 and 330b_2 in FIG. 6B are illustrated with diagonal lines as a perspective view. The inductor portions 330a_2 and 330b_2 in FIG. 6B are provided at substantially the same positions (substantially overlapping positions) as the inductor portions 330a_1 and 330b_1 in FIG. 6A, respectively, as viewed from the first surface F1 or the third surface F3 as illustrated. Further, it suffices that the inductor portions 330a_1, 330a_2, 330b_1, and 330b_2 illustrated in FIGS. 6A and 6B have substantially the same configurations as the inductor portion 330 illustrated in FIG. 3, although surfaces and positions at which they are formed are different from those of the inductor portion 330 in FIG. 3. Therefore, the inductor portions 330a_1, 330a_2, 330b_1, and 330b_2 are provided on both surfaces of the first and second semiconductor chips 30a and 30b, and are provided to substantially overlap each other as viewed in the stacking direction of the semiconductor chips 30.

The bumps 350 are provided at one ends on the first surface F1 side and the third surface F3 side, of the TSVs 340. In the present modification, the bumps 350 are not provided at the other ends on the second surface F2 side and the fourth surface F4 side, of the TSVs 340, but may be provided on the other ends on the second surface F2 side and the fourth surface F4 side. It suffices that other configurations of the first and second semiconductor chips 30a and 30b are identical to the configuration of the semiconductor chip 30 according to the first embodiment. The first and second semiconductor chips 30a and 30b have the same configuration as each other. Further, another semiconductor chip 30 has an identical configuration to that of the first and second semiconductor chips 30a and 30b illustrated in FIGS. 6A and 6B.

Because the inductor portions 330a_1, 330a_2, 330b_1, and 330b_2 are provided to substantially overlap each other as viewed in the stacking direction of the semiconductor chips 30, the first inductor portion 330a_1 arranged on the first surface F1 of the first semiconductor chip 30a in FIG. 5 is bonded to an inductor portion arranged on a surface of a semiconductor chip 30, which is opposed to the first surface F1, for example. The first inductor portion 330a_2 arranged on the second surface F2 of the first semiconductor chip 30a is bonded to the second inductor portion 330b_1 arranged on the third surface F3 of the second semiconductor chip 30b arranged below the first semiconductor chip 30a. The second inductor portion 330b_2 arranged on the fourth surface F4 of the second semiconductor chip 30b is bonded to an inductor portion arranged on a surface of another semiconductor chip 30, which is opposed to the fourth surface F4. Because the inductor portions of the respective semiconductor chips 30 are provided at substantially the same positions to have substantially the same shapes, as illustrated in FIG. 5, inductor portions provided to be opposed to each other between semiconductor chips 30 adjacent to each other in the Z-direction (for example, 330a_2 and 330b_1) form one inductor portion 330, when being bonded to each other by thermal press fitting.

Further, the inductor portions 330 are electrically connected to each other via the TSVs 340 and the bumps 350 to form one inductor element, as in the first embodiment. Therefore, the semiconductor device 1 according to the present modification can obtain identical effects to those of the semiconductor device 1 according to the first embodiment.

Furthermore, according to the present modification, opposing inductor portions (for example, 330a_2 and 330b_1) are bonded to each other by thermal press fitting to form one inductor portion 330. Therefore, the cross-sectional area of the inductor portion 330 in the Z-direction is larger than the cross-sectional area of the inductor portion 330 according to the first embodiment. Because of the increase of the cross-sectional area, internal electric resistance of the inductor portion 330 becomes smaller. Accordingly, antenna performance of the inductor element (for example, a Q factor) can be further increased.

(Second Embodiment)

Figure 7A:
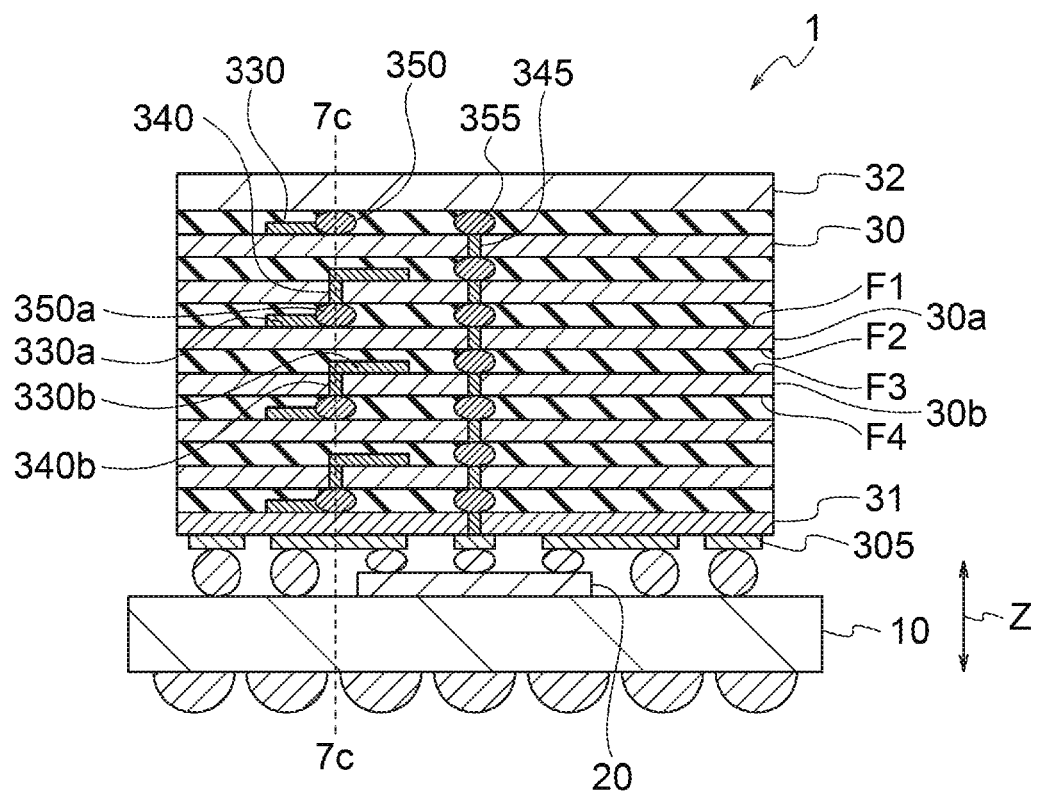
FIGS. 7A to 7C are cross-sectional views illustrating a configuration example of the semiconductor device according to a second embodiment.
Figure 7B:
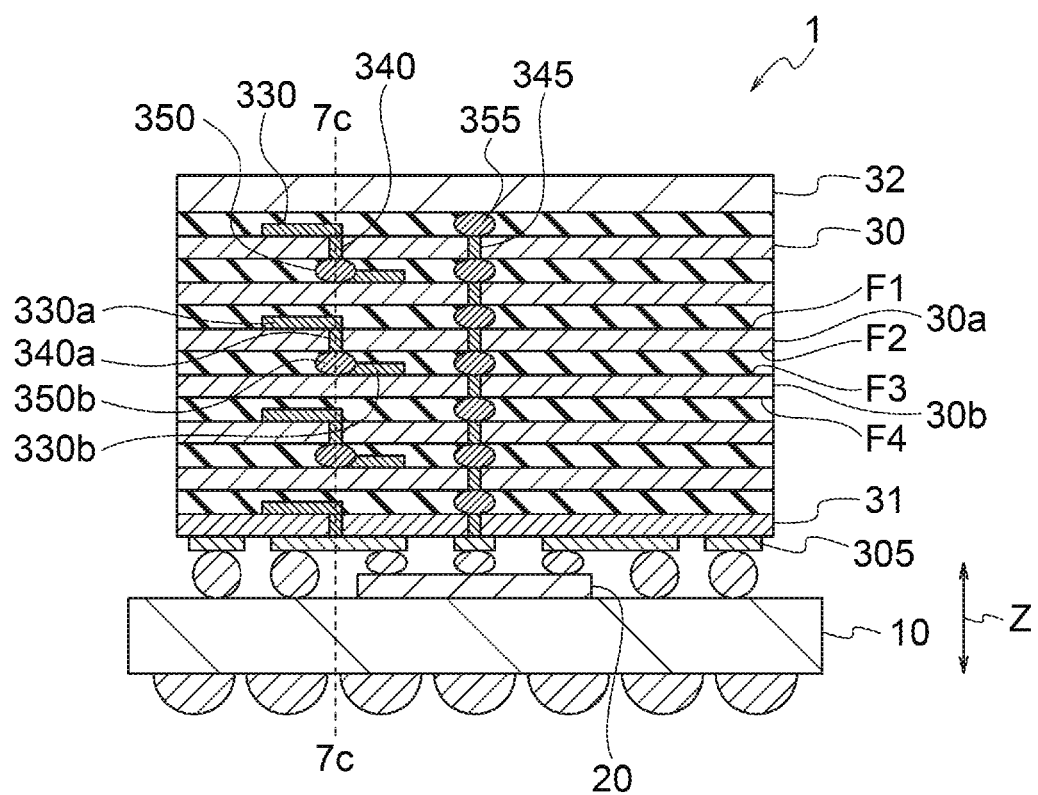
Figure 7C:
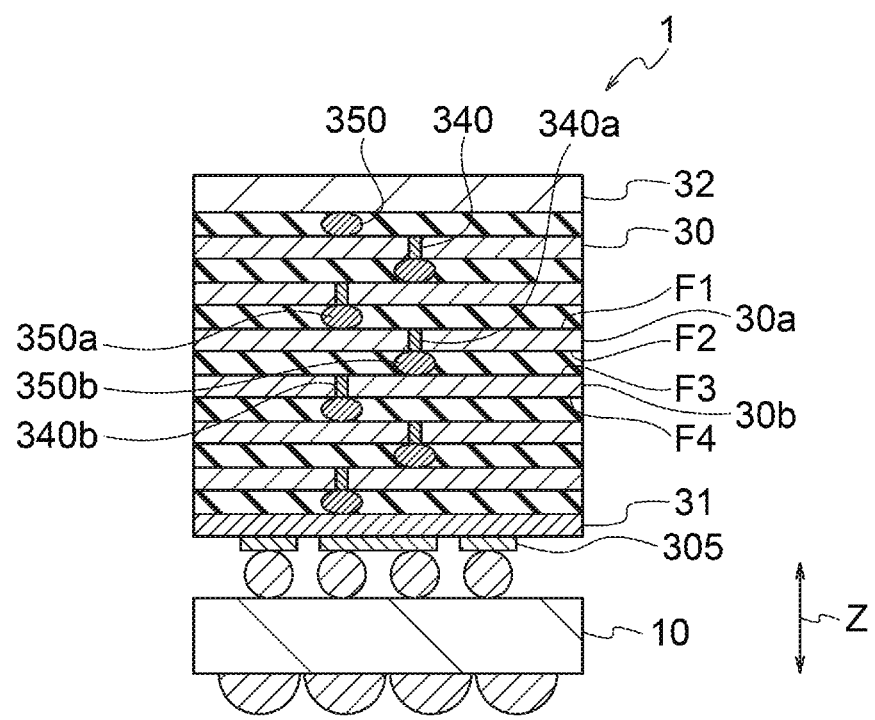
Figure 8A:
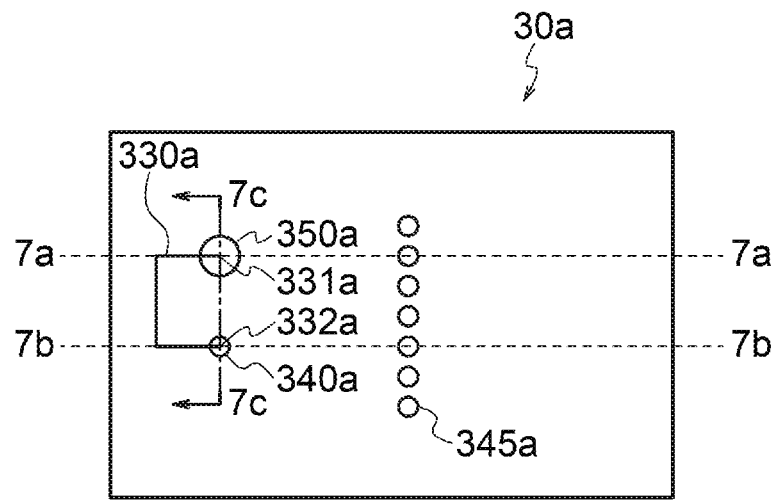
FIGS. 8A and 8B are plan views illustrating a configuration example of the first semiconductor chip and the second semiconductor chip, respectively.
Figure 8B:
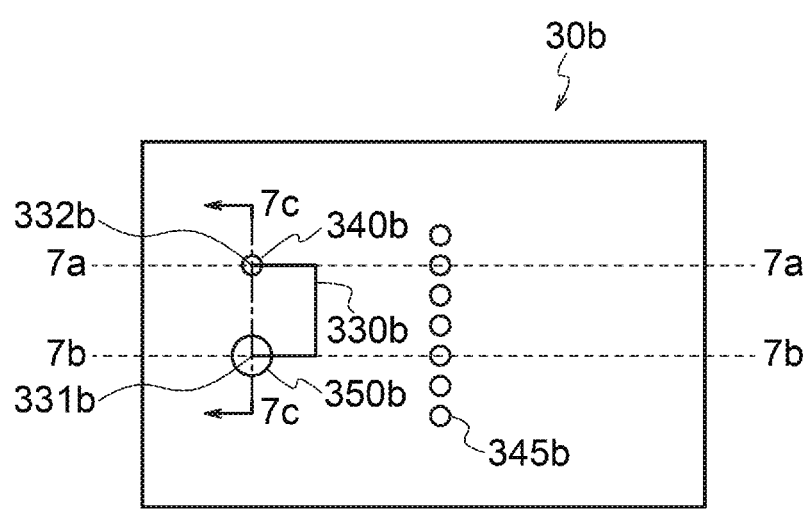

FIGS. 7A to 7C are cross-sectional views illustrating a configuration example of the semiconductor device 1 according to a second embodiment. FIGS. 8A and 8B are plan views illustrating a configuration example of the first semiconductor chip 30a and the second semiconductor chip 30b, respectively. FIG. 7A corresponds to a cross-section taken along a line 7a-7a in FIGS. 8A and 8B. FIG. 7B corresponds to a cross-section taken along a line 7b-7b in FIGS. 8A and 8B. FIG. 7C corresponds to a cross-section taken along a line 7c-7c in FIGS. 8A and 8B.

While the inductor portion 330 according to the first embodiment is a substantially annular wire, each inductor portion 330 according to the second embodiment is a substantially U-shaped wire as illustrated in FIGS. 8A and 8B.

It suffices that configurations other than the inductor portion 330, the TSV 340, and the bump 350 are identical to those in the first embodiment. Therefore, configurations of the inductor portion 330, the TSV 340, and the bump 350 are described, and detailed descriptions of the other configurations are omitted.

The first inductor portion 330a of the first semiconductor chip 30a illustrated in FIG. 8A is a substantially U-shaped wire having a first end 331a and a second end 332a. The second inductor portion 330b of the second semiconductor chip 30b illustrated in FIG. 8B is also a substantially U-shaped wire having a third end 331b and a fourth end 332b. The first and second inductor portions 330a and 330b are both substantially U-shaped and are symmetrical about the line 7c-7c as an axis (a boundary). Therefore, when the first semiconductor chip 30a of FIG. 8A and the second semiconductor chip 30b of FIG. 8B are alternately stacked, the inductor portions 330 alternately appear on right and left sides of the line 7c-7c (the TSV 340) as illustrated in FIGS. 7A and 7B. For example, the first inductor portion 330a appears on the left side of the line 7c-7c (the TSV 340) on the first surface F1 of the first semiconductor chip 30a, and the second inductor portion 330b appears on the right side of the line 7c-7c (the TSV 340) on the third surface F3 of the second semiconductor chip 30b. By alternately stacking the first and second semiconductor chips 30a and 30b respectively having the first and second inductor portions 330a and 330b in this manner, the first and second inductor portions 330a and 330b have a square shape similarly to the inductor portion 330 according to the first embodiment, as viewed in the stacking direction (Z-direction) of the semiconductor chips 30.

The shape of each of the first and second inductor portions 330a and 330b is not limited to a substantially U-shape. For example, the first inductor portion 330a may be an arc or a portion of a polygon, so long as it has two ends, that is, the first and second ends 331a and 332a. The shape of each of the first and second inductor portions 330a and 330b may be any shape, so long as the wires thereof have a substantially annular shape as viewed in the stacking direction of the first and second semiconductor chips 30a and 30b.

The first TSV 340a of the first semiconductor chip 30a illustrated in FIG. 8A is connected to the second end 332a. The first TSV 340a is provided between the first surface F1 and the second surface F2, as illustrated in FIGS. 7A and 7B, and penetrates through the first semiconductor chip 30a. The first bump 350a is provided on the first end 331a, as illustrated in FIG. 8A. Alternatively, the first bump 350a may be provided at a lower end of a TSV (an end opposed to the first end 331a) of a semiconductor chip provided above the first semiconductor chip 30a.

The second TSV 340b of the second semiconductor chip 30b illustrated in FIG. 8B is connected to the fourth end 332b. The second TSV 340b is provided between the third surface F3 and the fourth surface F4, as illustrated in FIGS. 7A and 7B, and penetrates through the second semiconductor chip 30b. The second bump 350b is provided on the third end 331b, as illustrated in FIG. 8B. Alternatively, the second bump 350b may be provided at a lower end of the TSV 340a (an end opposed to the third end 331b) of the first semiconductor chip 30a.

The second bump 350b is located below the first TSV 340a of the first semiconductor chip 30a as illustrated in FIG. 7B, and the second TSV 340b of the second semiconductor chip 30b is located below the first bump 350a as illustrated in FIG. 7A. That is, the first TSV 340a and the second bump 350b overlap each other and the second TSV 340b and the first bump 350a overlap each other, as viewed in the Z-direction. Therefore, when the first and second semiconductor chips 30a and 30b are alternately stacked, the positions of the first TSV 340a and the second bump 350b and the positions of the second TSV 340b and the first bump 350a alternately appear at shifted positions on the line 7c-7c, as illustrated in FIG. 7C. With this configuration, the inductor portions 330, the TSVs 340, and the bumps 350 form one substantially helical inductor element, as illustrated in FIG. 9, when the first semiconductor chip 30a and the second semiconductor chip 30b are stacked alternately as one unit.

Figure 9:
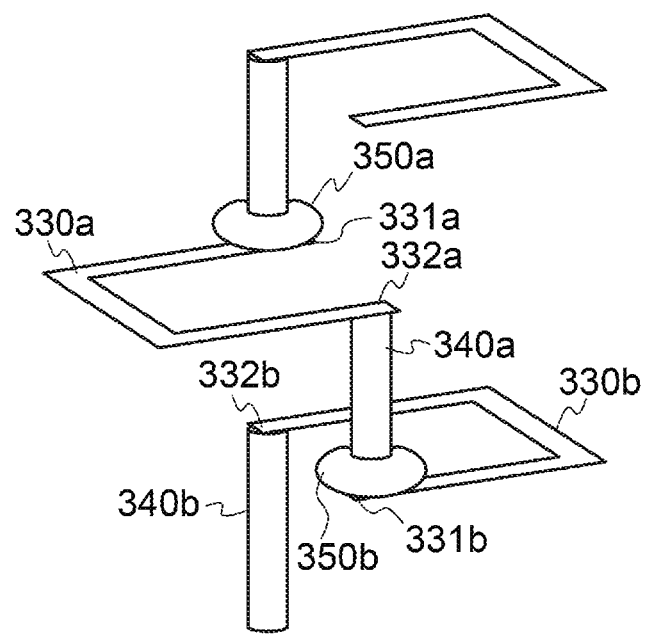
FIG. 9 is a schematic perspective view of the inductor portions, the TSVs, and the bumps according to the second embodiment.

FIG. 9 is a schematic perspective view of the inductor portions 330, the TSVs 340, and the bumps 350 according to the second embodiment.

The first end 331a of the first inductor portion 330a is connected to the TSV 340 of a semiconductor chip above the first semiconductor chip 30a via the first bump 350a. The second end 332a of the first inductor portion 330a is connected to the third end 331b of the second inductor portion 330b via the first TSV 340a and the second bump 350b. The fourth end 332b of the second inductor portion 330b is connected to a bump (not illustrated) of a semiconductor chip arranged below the second semiconductor chip 30b via the second TSV 340b.

In this manner, one first inductor portion 330a and one second inductor portion 330b are electrically connected to each other via the first TSV 340a and the second bump 350b to form a single-turn coil having a three-dimensional and substantially helical shape. Further, by stacking a plurality of units of semiconductor chips while assuming that one unit is formed by one first semiconductor chip 30a and one second semiconductor chip 30b, the first inductor portions 330a and the second inductor portions 330b form one inductor element that is wound a plurality of times and has a three-dimensional and substantially helical shape.

The shape of the first inductor portion 330a and the second inductor portion 330b is not limited to the substantially U-shape illustrated in FIGS. 8A and 8B, but may be a semicircular shape, a portion of a polygonal shape, or the like. Further, while the first inductor portion 330a and the second inductor portion 330b are symmetrical about the line 7c-7c as the axis, a relation therebetween is not limited thereto so long as they are continuously connected to each other. Further, the shape of the first inductor portion 330a and the second inductor portion 330b connected to each other, as viewed in the Z-direction, may be square, substantially circular, or polygonal, for example.

Further, the first bump 350a is provided at the first end 331a, but is not provided at the second end 332a, as illustrated in FIGS. 7A to 9. Similarly, the second bump 350b is provided at the third end 331b, but is not provided at the fourth end 332b. However, the bump 350 may be provided at each of the second end 332a and the fourth end 332b. Alternatively, the bump 350 may be provided at each of the first to fourth ends 331a, 331b, 332a, and 332b. In this case, mask patterns used for fabricating the bump 350 can be made the same in the first semiconductor chip 30a and the second semiconductor chip 30b. Therefore, the manufacturing process of the semiconductor device 1 can be more simplified.

When the first and second semiconductor chips 30a and 30b are stacked in this manner in the second embodiment, the second end 332a and the third end 331b are connected to each other via the first TSV 340a and the fourth end 332b is connected to the second TSV 340b. As viewed in the Z-direction, the first end 331a and the fourth end 332b overlap each other, and the wires of the first and second inductor portions 330a and 330b connected to each other by the first TSV 340a have a substantially annular shape. When the first and second semiconductor chips 30a and 30b are alternately stacked, inductor structures each including the first and second inductor portions 330a and 330b, the first and second TSVs 340a and 340b, and the second bump 350b as one unit are connected continuously and substantially helically, as illustrated in FIG. 9. Therefore, the inductor portions 330 form one long and substantially helical inductor element. Accordingly, the semiconductor device 1 according to the second embodiment can obtain identical effects to those of the semiconductor device 1 according to the first embodiment.

(Modification)

Figure 10A:
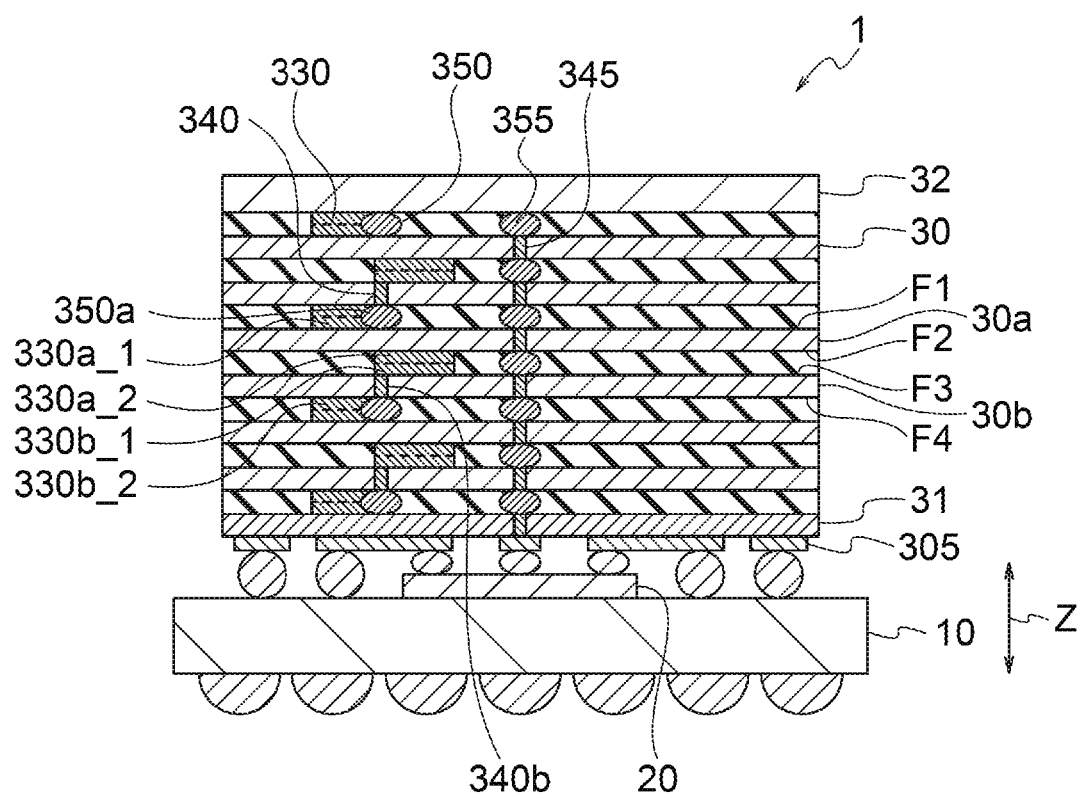
FIGS. 10A to 10C are cross-sectional views illustrating a configuration example of the semiconductor device according to a modification of the second embodiment.
Figure 10B:
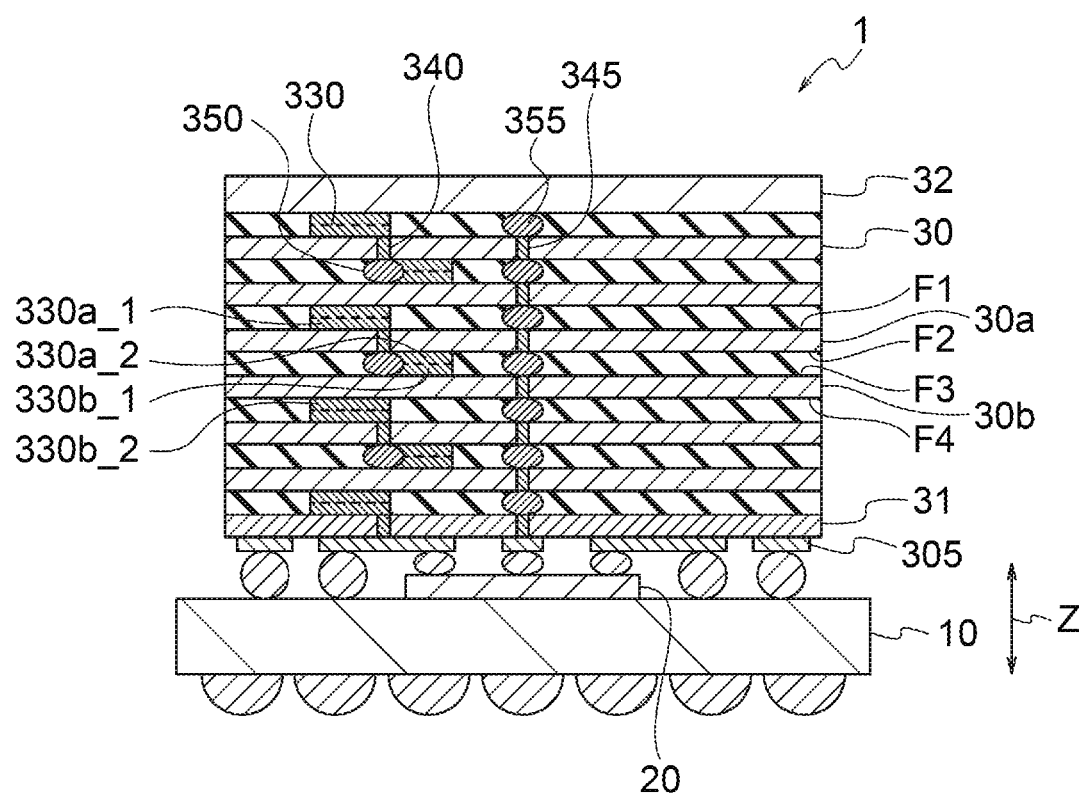
Figure 10C:
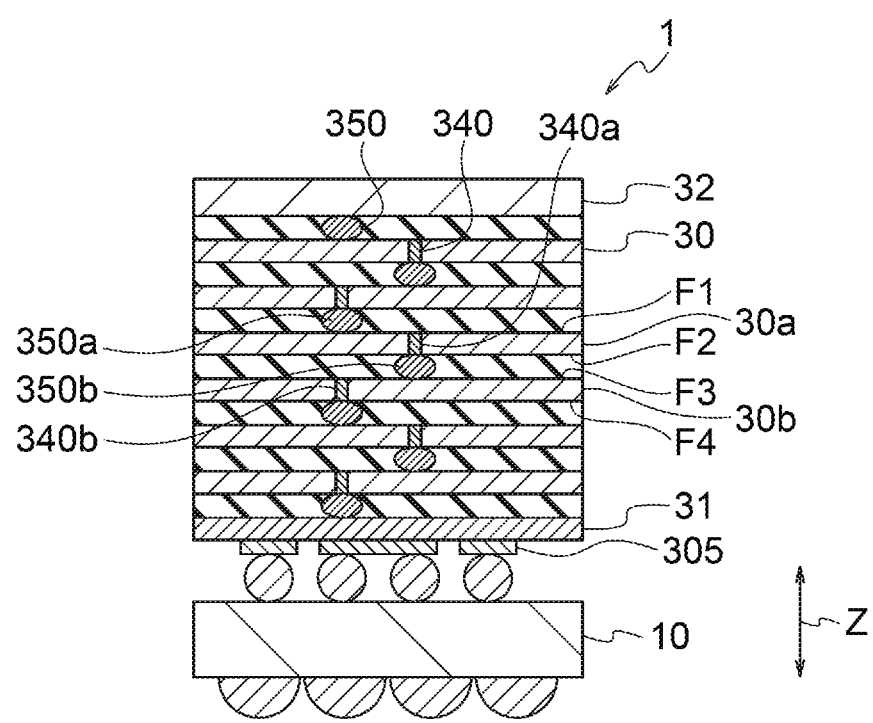

FIGS. 10A to 10C are cross-sectional views illustrating a configuration example of the semiconductor device 1 according to a modification of the second embodiment. The difference from the semiconductor device 1 according to the second embodiment is the configuration of the inductor portion 330. Therefore, detailed descriptions of other configurations are omitted.

The first inductor portion 330a according to the second embodiment is provided on either the first surface F1 or the second surface F2 of the first semiconductor substrate 310a.

The second inductor portion 330*b* is provided on either the third surface F3 or the fourth surface F4 of the second semiconductor substrate 310*b*. However, the first inductor portions 330*a*_1 and 330*a*_2 of the present modification are provided on both the first surface F1 and the second surface F2 of the first semiconductor chip 30*a*, respectively. Similarly, the second inductor portions 330*b*_1 and 330*b*_2 are provided on both the third surface F3 and the fourth surface F4 of the second semiconductor chip 30*b*,respectively. Further, the inductor portions 330*a*_2 and 330*b*_1 provided to be opposed to each other in the first and second semiconductor chips 30*a* and 30*b* mutually adjacent in the Z-direction are bonded to each other by thermal press fitting to form one inductor portion 330. Therefore, the configuration of the inductor element itself is the same as that illustrated in FIG. 9. However, the press-fitted inductor portion 330 (for example, 330*a*_2 and 330*b*_1) has a larger cross-sectional area when being cut along the Z-direction, as compared with that in the second embodiment. Therefore, antenna performance of the inductor element of the present modification is improved as compared with that in the second embodiment.

FIGS. 11A to 11D are plan views illustrating a configuration on an insulation film covering the semiconductor element 320 according to the modification of the second embodiment. FIG. 11A illustrates a configuration on the first surface F1 of the first semiconductor chip 30*a*. FIG. 11B illustrates a configuration on the second surface F2 side of the first semiconductor chip 30*a*, as viewed from the first surface F1 side. FIG. 11C illustrates a configuration on the third surface F3 of the second semiconductor chip 30*b*. FIG. 11D illustrates a configuration on the fourth surface F4 side of the semiconductor chip 30*b*, as viewed from the third surface F3 side.

Both FIGS. 11A and 11B are views of the first semiconductor chip 30*a*, as viewed from the first surface F1, and the first inductor portion 330*a*_2 in FIG. 11B is illustrated with a broken line as a perspective view. The first inductor portion 330*a*_2 in FIG. 11B is provided at substantially the same position (a substantially overlapping position) as the second inductor portion 330*b*_1 in FIG. 11C, as viewed from the first surface F1.

FIGS. 11C and 11D have a similar relation to that of FIGS. 11A and 11B. Therefore, both FIGS. 11C and 11D are views of the second semiconductor chip 30*b*, as viewed from the third surface F3, and the second inductor portion 330*b*_2 in FIG. 11D is illustrated with a broken line as a perspective view. The second inductor portion 330*b*_2 in FIG. 11D is provided at substantially the same position (a substantially overlapping position) as the first inductor portion 330*a*_1 in FIG. 11A, as viewed from the third surface F3.

It suffices that the first TSV 340*a* and the first bump 350*a* in FIG. 11A have identical configurations as those illustrated in FIG. 8A. Also, it suffices that the second TSV 340*b* and the second bump 350*b* in FIG. 11B have identical configurations as those illustrated in FIG. 8B.

The inductor portions 330*a*_1 and 330*b*_2 substantially overlap each other, as viewed in the Z-direction. The inductor portions 330*a*_2 and 330*b*_1 also substantially overlap each other, as viewed in the Z-direction. Therefore, when the first and second semiconductor chips 30*a* and 30*b* are alternately stacked, the first inductor portion 330*a*_1 arranged on the first surface F1 of the first semiconductor chip 30*a* in FIGS. 10A and 10B is bonded to an inductor portion arranged on a surface of a semiconductor chip 30, which is opposed to the first surface F1, for example. The first inductor portion 330*a*_2 arranged on the second surface F2 of the first semiconductor chip 30*a* is bonded to the second inductor portion 330*b*_1 arranged on the third surface F3 of the second semiconductor chip 30*b* below the first semiconductor chip 30*a*. The second inductor portion 330*b*_2 arranged on the fourth surface F4 of the second semiconductor chip 30*b* is bonded to an inductor portion arranged on a surface of another semiconductor chip 30, which is opposed to the fourth surface F4.

Because inductor portions respectively arranged on opposing surfaces of the semiconductor chips 30 are provided at substantially the same positions to have substantially the same shapes, inductor portions provided to be opposed to each other between semiconductor chips 30 mutually adjacent in the Z-direction (for example, 330*a*_2 and 330*b*_1) form one inductor portion 330, when being bonded to each other by thermal press fitting, as illustrated in FIGS. 10A and 10B.

Further, the inductor portions 330 are electrically connected to each other via the TSVs 340 and the bumps 350 similarly to the second embodiment to form one inductor element. Therefore, the semiconductor device 1 according to the present modification can obtain identical effects to those of the semiconductor device 1 according to the second embodiment.

Furthermore, according to the present modification, opposing inductor portions (for example, 330*a*_2 and 330*b*_1) are bonded to each other by thermal press fitting to form one inductor portion 330. Therefore, the cross-sectional area of the inductor portion 330 in the Z-direction is larger than the cross-sectional area of the inductor portion 330 according to the second embodiment. Because of the increase of the cross-sectional area, internal electric resistance of the inductor portion 330 becomes smaller. Accordingly, antenna performance of the inductor element (for example, a Q factor) can be further increased.

(Third Embodiment)

Figure 12A:
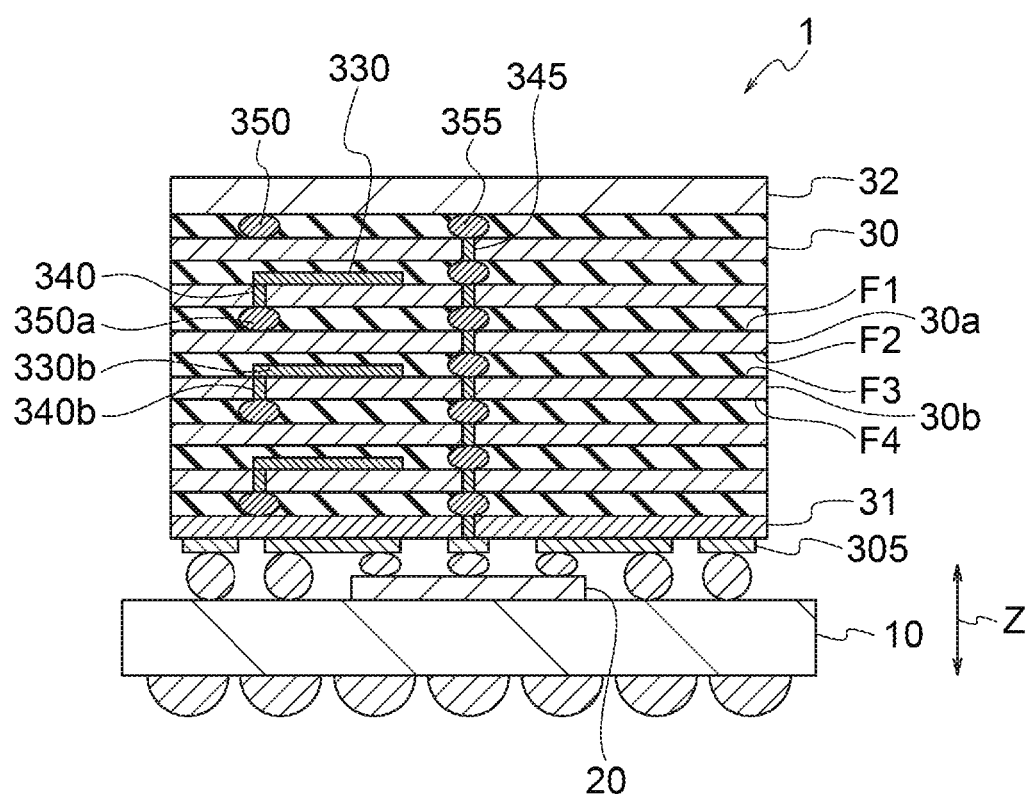
FIGS. 12A and 12B are cross-sectional views illustrating a configuration example of the semiconductor device according to a third embodiment.
Figure 12B:
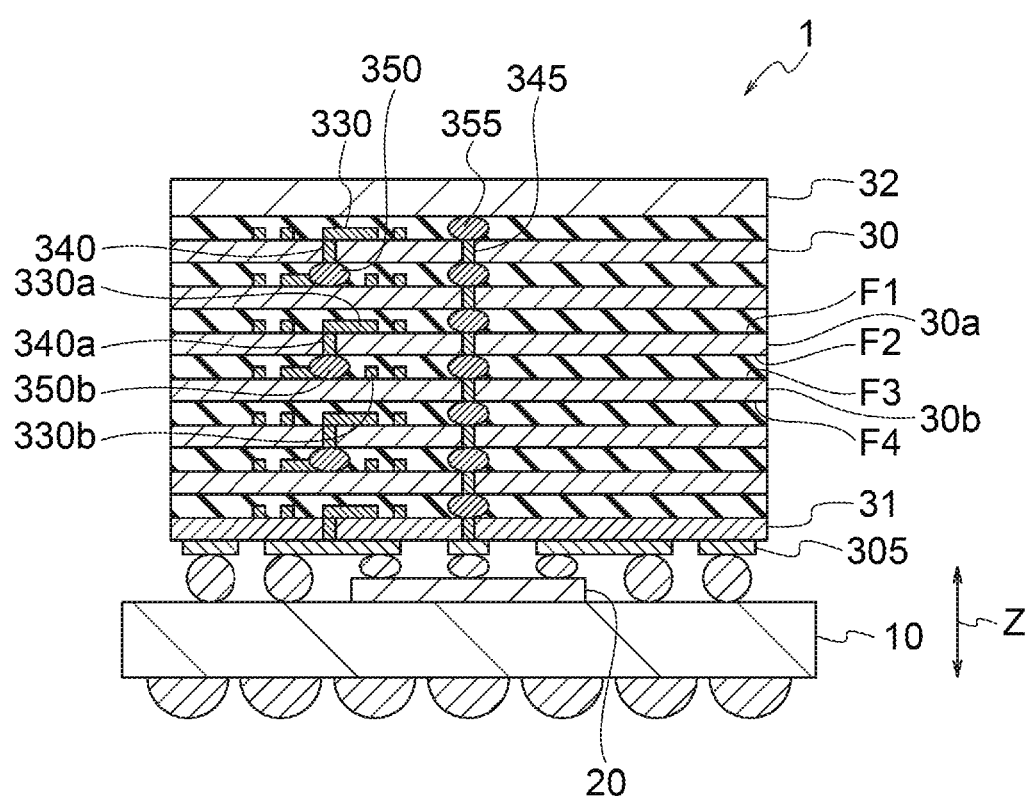
Figure 13A:
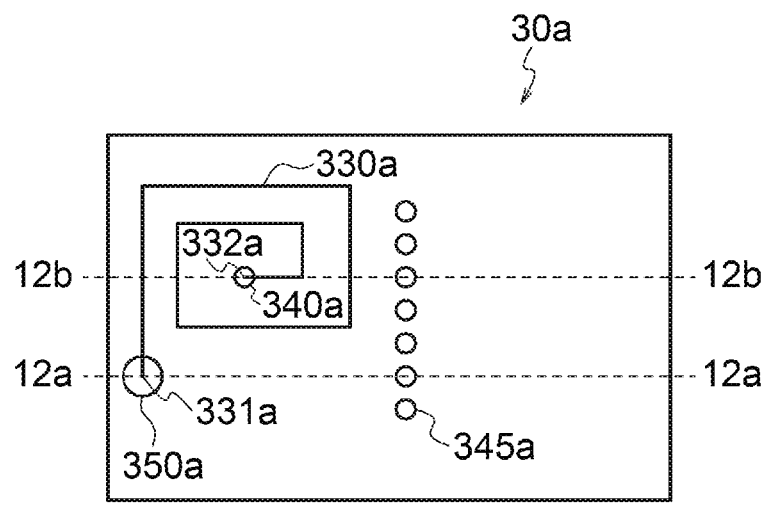
FIGS. 13A and 13B are plan views illustrating a configuration example of the first and second semiconductor chips, respectively.
Figure 13B:
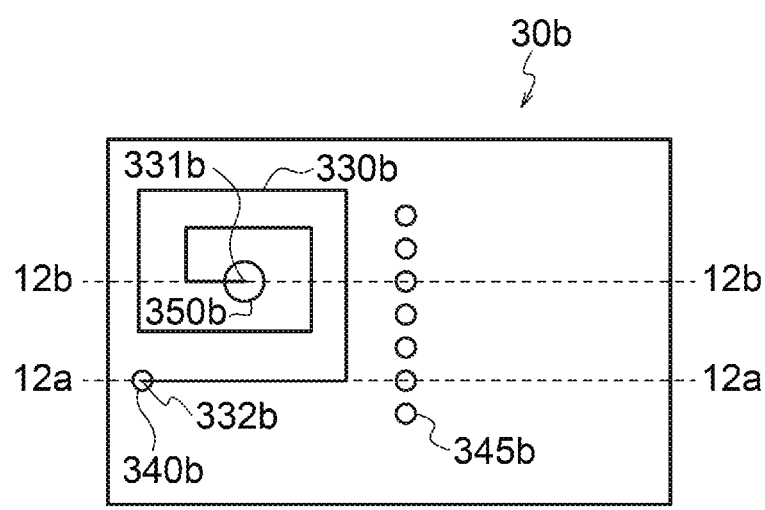

FIGS. 12A and 12B are cross-sectional views illustrating a configuration example of the semiconductor device 1 according to a third embodiment. FIGS. 13A and 13B are plan views illustrating a configuration example of the first and second semiconductor chips 30*a* and 30*b*, respectively. FIG. 12A corresponds to a cross-section taken along a line 12*a*-12*a* in FIGS. 13A and 13B. FIG. 12B corresponds to a cross-section taken along a line 12*b*-12*b* in FIGS. 13A and 13B.

The first inductor portion 330*a* and the second inductor portion 330*b* according to the second embodiment each have a substantially U-shape. However, each of the first inductor portion 330*a* and the second inductor portion 330*b* according to the third embodiment is a wire having a substantially spiral shape. The first inductor portion 330*a* and the second inductor portion 330*b* according to the third embodiment are the same as those of the second embodiment in being wires each having two ends.

The first inductor portion 330*a* of the first semiconductor chip 30*a* illustrated in FIG. 13A is a wire having a substantially spiral shape and including the first end 331*a* and the second end 332*a*. The wire of the first inductor portion 330*a* has a substantially spiral shape in a first direction (clockwise direction) from outside to inside.

The first TSV 340*a* and the first bump 350*a* are connected to the second end 332*a* and the first end 331*a*, respectively, as illustrated in FIG. 13A. Other configurations of the first TSV 340*a* and the first bump 350*a* are identical to those of the first TSV 340*a* and the first bump 350*a* of the semiconductor device 1 according to the second embodiment, and therefore detailed descriptions thereof are omitted.

The second inductor portion 330b of the second semiconductor chip 30b illustrated in FIG. 13B is a wire having a substantially spiral shape and including the third end 331b and the fourth end 332b. The wire of the second inductor portion 330b has a substantially spiral shape in the first direction from inside to outside, opposite to the first inductor portion 330a.

The second TSV 340b and the second bump 350b are connected to the fourth end 332b and the third end 331b, respectively, as illustrated in FIG. 13B. Other configurations of the second TSV 340b and the second bump 350b are identical to those of the second TSV 340b and the second bump 350b of the semiconductor device 1 according to the second embodiment, and therefore detailed descriptions thereof are omitted.

Further, the second end 332a and the third end 331b overlap each other and the first end 331a and the fourth end 332b overlap each other, as viewed in the Z-direction that is the stacking direction of the first and second semiconductor chips 30a and 30b. Therefore, in the first inductor portion 330a and the second inductor portion 330b, the second end 332a and the third end 331b, which are rotation axes (centers) of spirals, respectively, are located at substantially the same positions as each other.

Because the first and second inductor portions 330a and 330b are substantially spiral, the second inductor portion 330b of the second semiconductor chip 30b appears linearly in the cross-section illustrated in FIG. 12A, while the first inductor portion 330a of the first semiconductor chip 30a does not appear. In the cross-section illustrated in FIG. 12B, both the first and second inductor portions 330a and 330b appear discretely.

Figure 14:
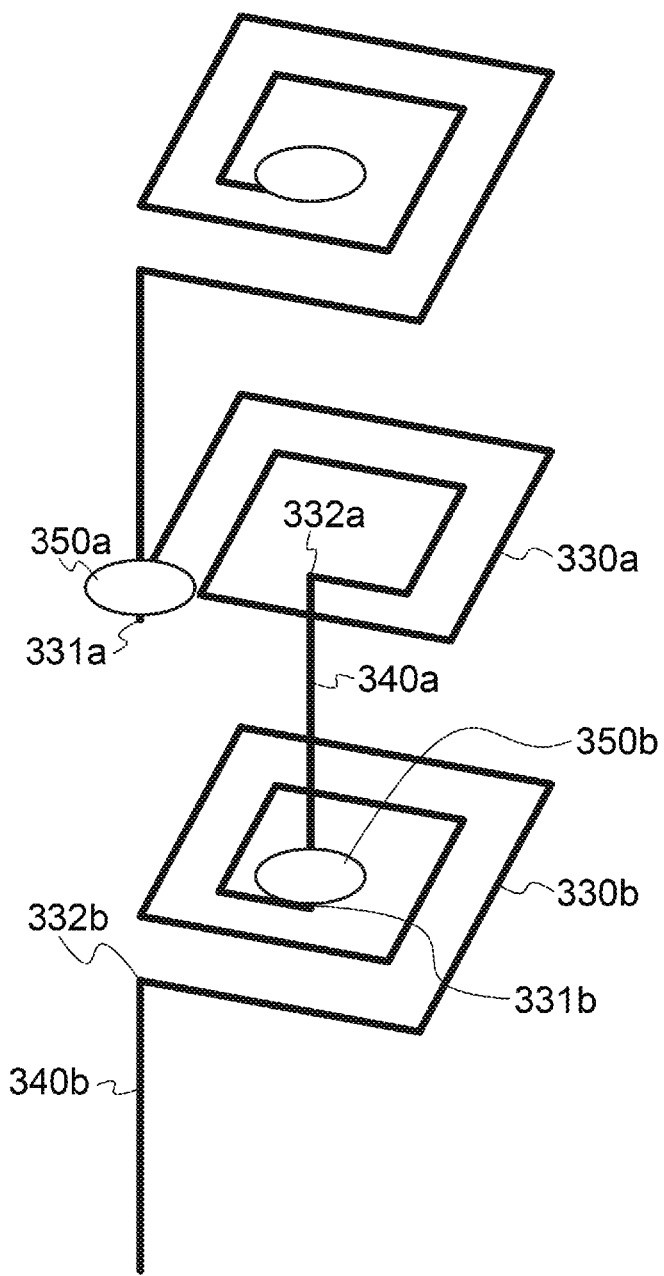
FIG. 14 is a schematic perspective view of the inductor portions, the TSVs, and the bumps according to the third embodiment.

By alternately stacking the first and second semiconductor chips 30a and 30b respectively having the first and second inductor portions 330a and 330b described above, the first and second inductor portions 330a and 330b each having a substantially spiral shape are connected to each other substantially helically, as illustrated in FIG. 14. Due to this connection, the inductor portions 330, the TSVs 340, and the bumps 350 form one substantially helical inductor element, as illustrated in FIG. 14, when the first semiconductor chip 30a and the second semiconductor chip 30b are alternately stacked as one unit.

FIG. 14 is a schematic perspective view of the inductor portions 330, the TSVs 340, and the bumps 350 according to the third embodiment.

Connecting relations among the first end 331a to the fourth end 332b, the TSVs 340, and the bumps 350 are identical to those described with reference to FIG. 9, and therefore descriptions thereof are omitted.

In this manner, one first inductor portion 330a and one second inductor portion 330b are electrically connected to each other via the first TSV 340a and the second bump 350b to form a multi-turn coil having a three-dimensional and substantially helical shape. Further, by stacking a plurality of units of semiconductor chips while it is assumed that one unit is formed by one first semiconductor chip 30a and one second semiconductor chip 30b, the first inductor portions 330a and the second inductor portions 330b form one inductor element that is wound a plurality of times and has a three-dimensional and substantially helical shape.

Further, one first inductor portion 330a and one second inductor portion 330b are electrically connected to each other via the TSV 340 and the bump 350 to form a shape in which a clockwise spiral from outside to inside and a clockwise spiral from inside to outside are continuously connected to each other. Therefore, as illustrated in FIG. 14, the first inductor portion 330a extends from the first end 331a to inside substantially spirally in a clockwise direction, and is connected at the second end 332a to the third end 331b of the second inductor portion 330b via the first TSV 340a and the second bump 350b. The second inductor portion 330b then extends from the third end 331b to outside substantially spirally in a clockwise direction to the fourth end 332b.

The rotation axes of the respective spirals are substantially the same as each other, and rotating directions of the respective spirals are the same as each other as viewed in the Z-direction that is the stacking direction of the first and second semiconductor chips 30a and 30b. Further, by stacking the plural semiconductor chips 30 while one unit is assumed to be formed by the first semiconductor chip 30a and the second semiconductor chip 30b, one inductor element is obtained in which the spirals are connected to each other substantially helically.

The numbers of windings of the respective spirals of the first inductor portion 330a and the second inductor portion 330b are not limited to those illustrated in FIGS. 13A and 13B. For example, a Q factor can be increased by increasing the number of windings of the spiral.

Further, the shapes of the windings of the first inductor portion 330a and the second inductor portion 330b are not limited to those illustrated in FIGS. 13A and 13B. For example, each of the shapes of the first inductor portion 330a and the second inductor portion 330b may be a circular spiral, an elliptical spiral, or a polygonal spiral.

In this manner, the wire of the first inductor portion 330a according to the third embodiment has the spiral from outside to inside in the first direction. The wire of the second inductor portion 330b has the spiral from inside to outside in the first direction. The second end 332a and the third end 331b are connected to each other via the first TSV 340a, and the fourth end 332b is connected to the second TSV 340b. The first end 331a and the fourth end 332b overlap each other, as viewed in the stacking direction of the first and second semiconductor chips 30a and 30b. With this configuration, when the first and second semiconductor chips 30a and 30b are alternately stacked, inductor structures each having the first and second inductor portions 330a and 330b, the first and second TSVs 340a and 340b, and the second bump 350b as a unit are connected to each other continuously and helically, as illustrated in FIG. 14. Therefore, the semiconductor device 1 according to the third embodiment can obtain an inductor element having excellent antenna performance (for example, a high Q factor). The semiconductor device 1 according to the third embodiment can obtain identical effects to those of the semiconductor device 1 according to the first and second embodiments.

(Modification)

In the present modification, the modification of the second embodiment is applied to the semiconductor device 1 according to the third embodiment.

Figure 15A:
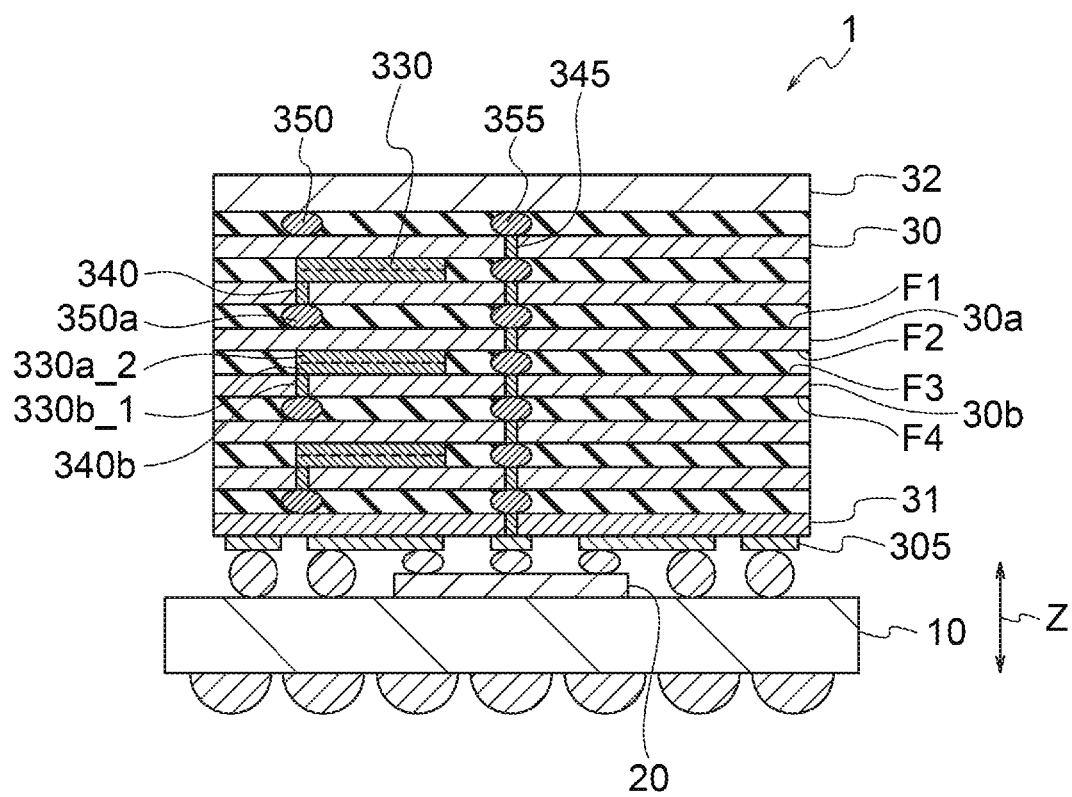
FIGS. 15A and 15B are cross-sectional views illustrating a configuration example of the semiconductor device according to the modification of the third embodiment.
Figure 15B:
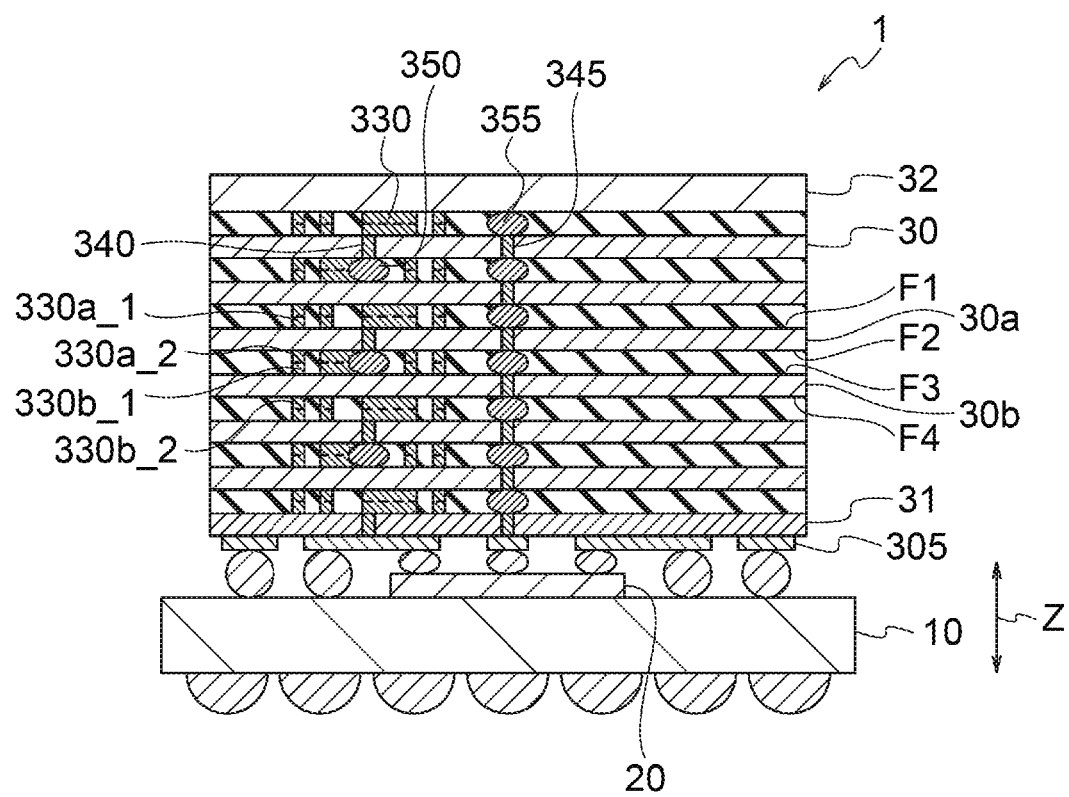

FIGS. 15A and 15B are cross-sectional views illustrating a configuration example of the semiconductor device 1 according to the modification of the third embodiment.

Figure 16A:
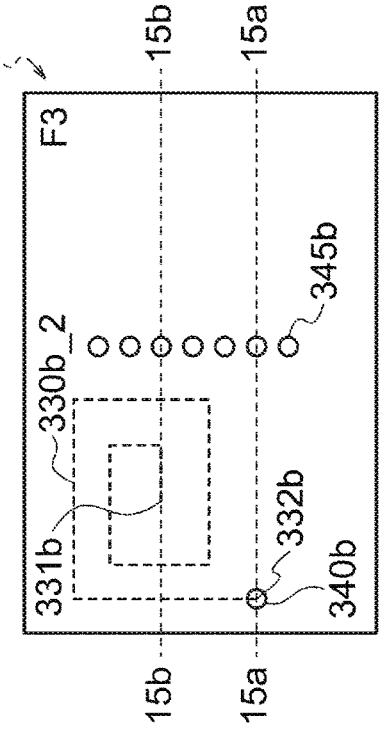
FIGS. 16A to 16D are plan views illustrating a configuration example of the first and second semiconductor chips according to the modification of the third embodiment.
Figure 16B:
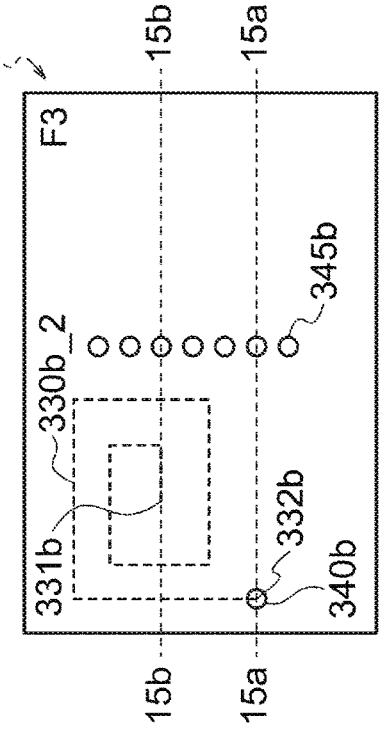
Figure 16C:
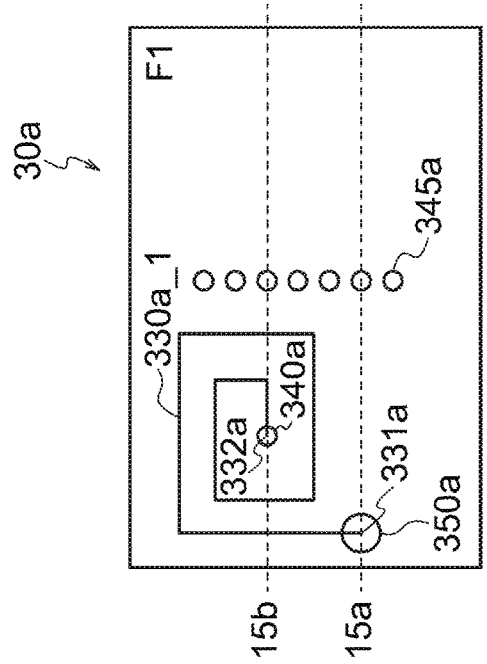
Figure 16D:
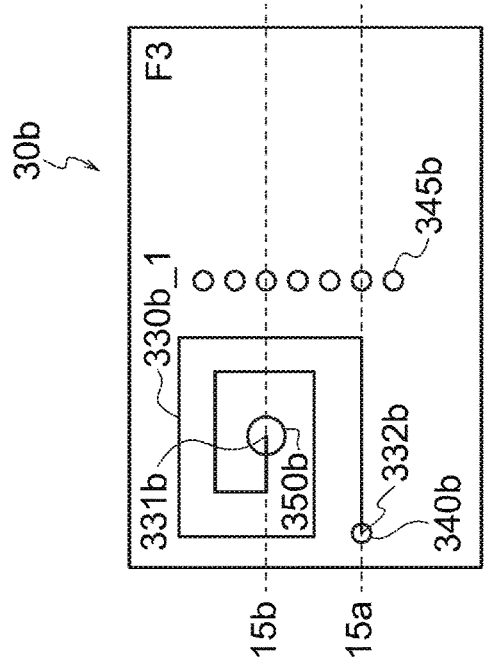

FIGS. 16A to 16D are plan views illustrating a configuration example of the first and second semiconductor chips 30a and 30b according to the modification of the third embodiment. FIG. 16A illustrates a configuration of the first semiconductor chip 30a in the first surface F1. FIG. 16B illustrates a configuration of the second semiconductor chip 30b in the third surface F3. FIG. 16C illustrates a configuration of the first semiconductor chip 30a in the second surface F2. FIG. 16D illustrates a configuration of the second semiconductor chip 30b in the fourth surface F4. FIGS. 16A to 16D are views of the first and second semiconductor chips 30a and 30b, as viewed in the stacking direction thereof and from the same direction respectively. FIG. 15A corresponds to a cross-section taken along a line 15a-15a in FIGS. 16A to 16D. FIG. 15B corresponds to a cross-section taken along a line 15b-15b in FIGS. 16A to 16D.

Because the semiconductor device 1 according to the modification of the third embodiment is a combination of the third embodiment and the modification of the second embodiment, it can be easily understood from the descriptions of the third embodiment and the modification of the second embodiment. Therefore, detailed descriptions of the semiconductor device 1 according to the present modification are omitted. The present modification can obtain effects identical to those of third embodiment and the modification of the second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a first semiconductor chip including a first semiconductor element provided on a first surface of a first semiconductor substrate, a first inductor portion provided above the first surface of the first semiconductor substrate or a second surface on an opposite side to the first surface, a first metal electrode provided between the first surface and the second surface to penetrate through the first semiconductor substrate and to be connected to the first inductor portion, and a first bump provided in the same layer as the first inductor portion or on the first inductor portion; and
   a second semiconductor chip including a second semiconductor element provided on a third surface of a second semiconductor substrate, a second inductor portion provided above the third surface of the second semiconductor substrate or a fourth surface on an opposite side to the third surface, a second metal electrode provided between the third surface and the fourth surface to penetrate through the second semiconductor substrate and to be connected to the second inductor portion, and a second bump provided in the same layer as the second inductor portion or on the second inductor portion, wherein
   the first and second semiconductor chips are stacked, and
   the first and second inductor portions are electrically connected to each other via the first metal electrode and the second bump or via the second metal electrode and the first bump, as one inductor element.

2. The device of claim 1, wherein the first and second inductor portions have a substantially annular shape.

3. The device of claim 1, wherein the first inductor portion and the second inductor portion overlap each other and the first metal electrode and the second metal electrode overlap each other, as viewed in a stacking direction of the first and second semiconductor chips.

4. The device of claim 2, wherein the first inductor portion and the second inductor portion overlap each other and the first metal electrode and the second metal electrode overlap each other, as viewed in a stacking direction of the first and second semiconductor chips.

5. The device of claim 1, wherein the first and second semiconductor chips are semiconductor chips having a substantially same configuration.

6. The device of claim 2, wherein the first and second semiconductor chips are semiconductor chips having a substantially same configuration.

7. The device of claim 1, wherein
   the first inductor portion is a wire including a first end and a second end, the first end being connected to the first metal electrode, and the second end being connected to the first bump,
   the second inductor portion is a wire including a third end and a fourth end, the third end being connected to the second metal electrode, and the fourth end being connected to the second bump,
   the second and third ends are connected to each other via the second metal electrode and the first bump or via the first metal electrode and the second bump, and
   as viewed in a stacking direction of the first and second semiconductor chips, the first end and the fourth end overlap each other and the wire of the first and second inductor portions connected to each other by the first or second metal electrode has a substantially annular shape.

8. The device of claim 1, wherein
   the first inductor portion is a wire including a first end and a second end, the first end being connected to the first metal electrode, and the second end being connected to the first bump,
   the second inductor portion is a wire including a third end and a fourth end, the third end being connected to the second metal electrode, and the fourth end being connected to the second bump,
   the wire of each of the first and second inductor portions has a substantially spiral shape,
   the second and third ends are connected to each other via the second metal electrode and the first bump or via the first metal electrode and the second bump, and
   the first end and the fourth end overlap each other, as viewed in a stacking direction of the first and second semiconductor chips.

9. The device of claim 8, wherein
   the wire of the first inductor portion has a spiral from outside to inside in a first direction, and
   the wire of the second inductor portion has a spiral from inside to outside in the first direction.

10. The device of claim 1, wherein the first and second inductor portions are electrically connected to each other to function as one antenna.

11. The device of claim 1, wherein the first and second metal electrodes are made of any of Ti, Cu, Ni, Au, and Sn, or a stacked body thereof, or alloy thereof.

* * * * *